(12) United States Patent
Sugano et al.

(10) Patent No.: US 7,669,780 B2
(45) Date of Patent: Mar. 2, 2010

(54) FLUID SUPPLY NOZZLE, SUBSTRATE PROCESSING APPARATUS AND SUBSTRATE PROCESSING METHOD

(75) Inventors: Kou Sugano, Osaka (JP); Hiroshi Yoshioka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/010,962

(22) Filed: Jan. 31, 2008

(65) Prior Publication Data

US 2008/0203182 A1   Aug. 28, 2008

Related U.S. Application Data

(62) Division of application No. 11/014,945, filed on Dec. 20, 2004, now abandoned.

(30) Foreign Application Priority Data

Dec. 24, 2003   (JP) .............................. 2003-426845

(51) Int. Cl.
    *B05B 17/04*   (2006.01)
(52) U.S. Cl. .................. 239/11; 239/592; 239/594; 239/597; 239/601; 118/320; 427/335; 134/902
(58) Field of Classification Search ................ 239/568, 239/592–594, 601; 118/320; 427/335; 134/902
    See application file for complete search history.

(56) References Cited

U.S. PATENT DOCUMENTS 1,133,711 A    3/1915  Cornelius
2,039,938 A    5/1936  Schultz
2,116,863 A    5/1938  Dinley
2,684,690 A    7/1954  Lee
4,043,397 A    8/1977  Glowieke
4,236,672 A    12/1980 Koeberle
4,326,553 A    4/1982  Hall
5,779,816 A *  7/1998  Trinh .......................... 134/23

FOREIGN PATENT DOCUMENTS

| JP | 56-141860   | 11/1981 |
| JP | 2001-044602 | 2/2001  |
| JP | 2001-68449  | 3/2001  |
| JP | 2002-151455 | 5/2002  |

OTHER PUBLICATIONS

Foreign Office Action dated Jan. 30, 2007 for Patent Application No. 2004-334609.

* cited by examiner

*Primary Examiner*—Dinh Q Nguyen
(74) *Attorney, Agent, or Firm*—McDermott Will & Emery LLP

(57) ABSTRACT

A fluid supply nozzle includes a fluid flow-in section into which a fluid flows in, a reservoir section for storing the fluid, a flow velocity control wall provided between the fluid flow-in section and the reservoir section and including an orifice for making the fluid flow in the reservoir section while reducing a flow velocity, and a discharging section including a slit for discharging the fluid with pressure of the fluid applied to the reservoir section. A substrate processing apparatus is formed so as to include the fluid supply nozzle. Moreover, a substrate processing method includes the step of discharging a fluid in a single-layered, continuous film to supply the fluid onto a substrate. Thus, the substrate is processed. To perform this method, the fluid supply nozzle of the present invention can be used.

11 Claims, 14 Drawing Sheets

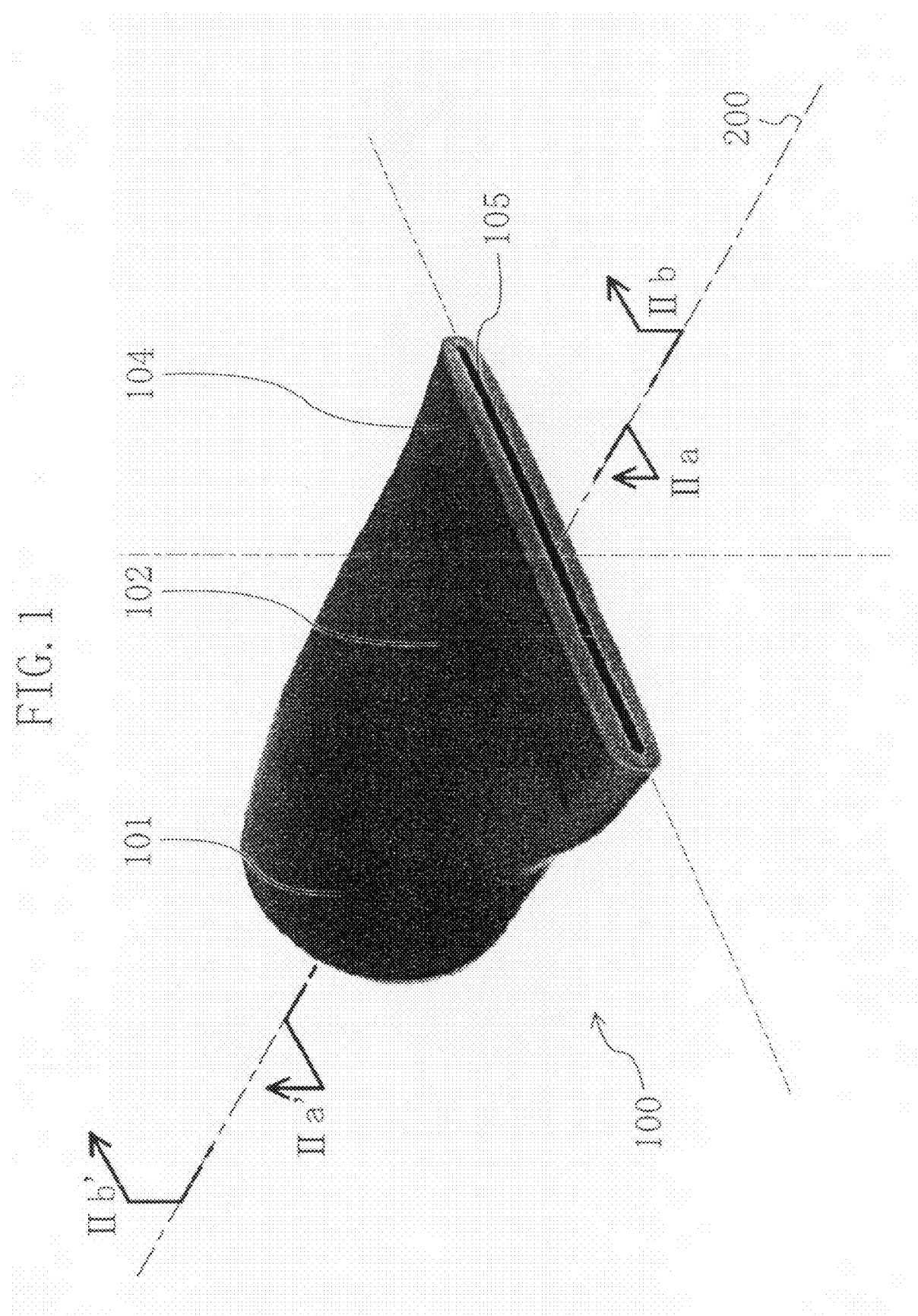

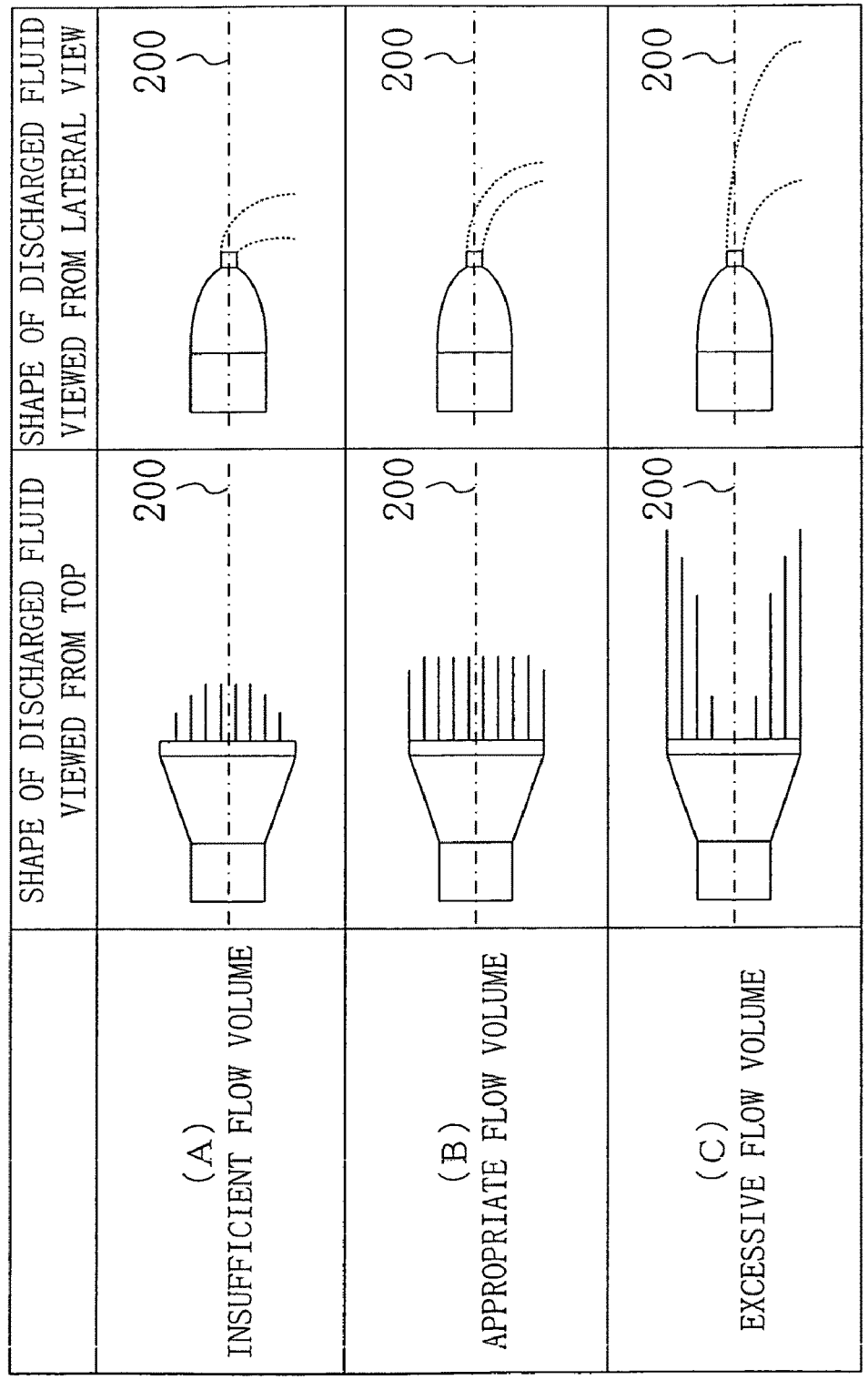

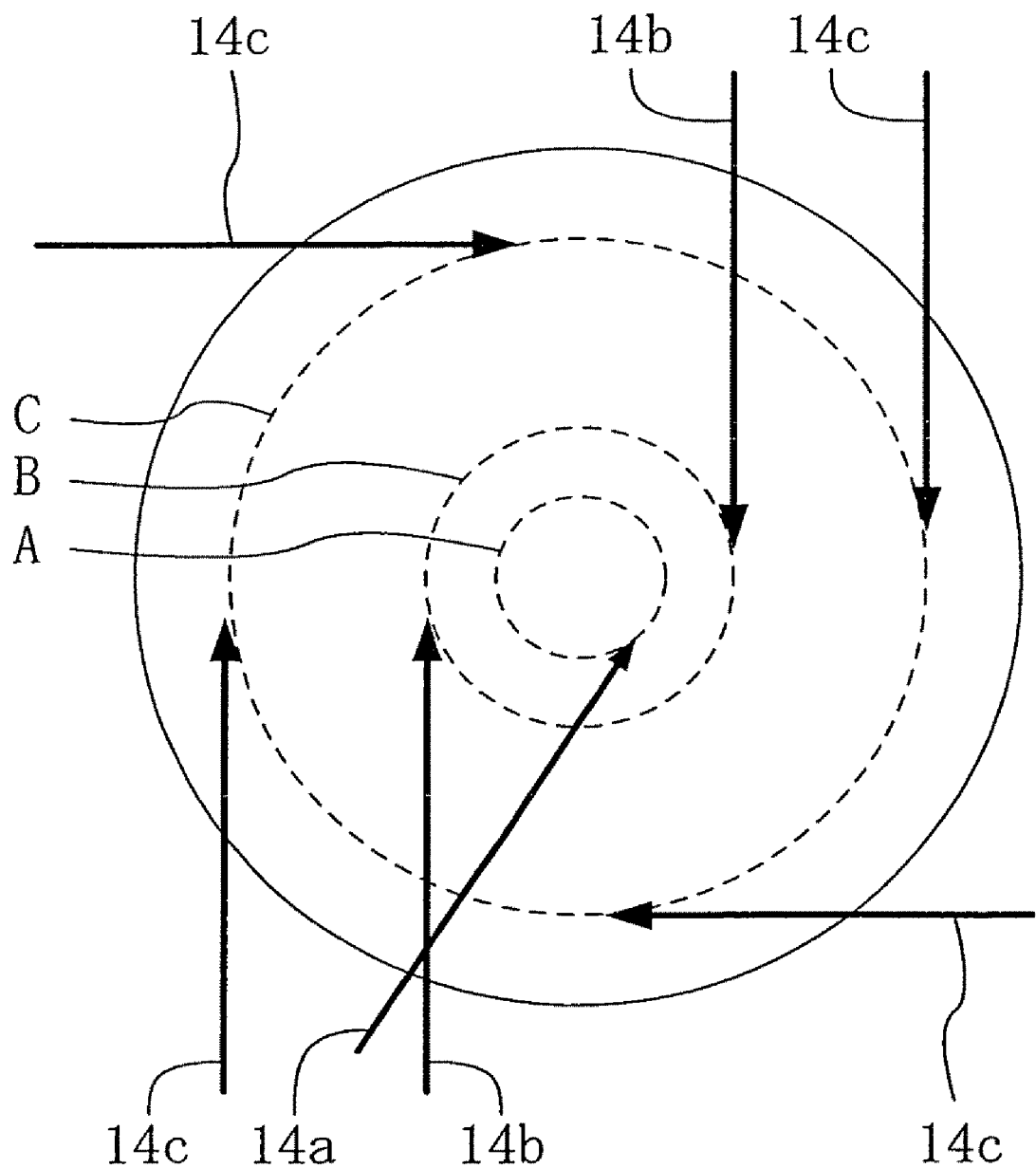

FLUID SUPPLY NOZZLE, SUBSTRATE PROCESSING APPARATUS AND SUBSTRATE PROCESSING METHOD

CROSS-REFERENCE TO RELATED APPLICATIONS

This application is a Divisional of U.S. application Ser. No. 11/014,945, filed Dec. 20, 2004 now abandoned, claiming priority of Japanese Patent Application No. 2003-426845 filed on Dec. 24, 2003, the entire contents of each of which are incorporated herein by reference.

BACKGROUND OF THE INVENTION

The present invention relates to fluid supply nozzles, and more particularly relates to a fluid supply nozzle for use in substrate processing for a semiconductor device or a flat display panel (such as a liquid crystal display device and a plasma display panel (PDP)) and the like and substrate processing apparatus and method using the fluid supply nozzle.

As for processing of a semiconductor substrate using a fluid in process steps for fabricating a semiconductor device, not only wet etching of a semiconductor substrate but also cleaning of a semiconductor substrate using various types of fluids and the like are used. Such processing is performed in all places in process steps for fabricating a semiconductor device. Conventionally, a batch processing method in which a plurality of wafers are soaked in a fluid bath at a same time and then wet etching or cleaning is performed has been used in many cases. However, in such a batch processing method, whether the number of semiconductor substrates to be processed is large or small, a large fluid processing bath is needed. Therefore, with increase in the diameter of semiconductor substrates, the size of an entire fabrication apparatuses is increased.

Moreover, even though a plurality of semiconductor substrates are processed at a time using a batch processing apparatus, with the subsequent process step using a single-wafer-processing apparatus, a waiting time is different for each semiconductor substrate. As a result, in a semiconductor substrate which is to be left with a long waiting time after wet etching, an inconvenient phenomenon such as the generation of a natural oxide film on a surface of the semiconductor substrate, which affects device properties of a semiconductor device occurs.

Then, it has been proposed to use, as in other process steps, a single-wafer-processing apparatus for processing a semiconductor substrate one by one in a substrate processing apparatus using a fluid.

A single-wafer-processing substrate processing apparatus using a fluid supplies a fluid for a certain amount of time to a front or back surface of a semiconductor substrate from a fluid supply nozzle provided in the vicinity of a center portion of a semiconductor substrate and then performs wet etching or surface processing and the like, while rotating the semiconductor substrate placed on a rotation table. However, for a single-wafer-processing substrate processing apparatus using a fluid, the following problem arises with the increase in the diameter of semiconductor substrates.

That is, in the center portion of the semiconductor substrate, a large volume of a clean fluid is supplied and a surface of the semiconductor substrate is sufficiently processed with the fluid. However, in contrast, the volume of a processing fluid per unit area decreases in a closer portion of the semiconductor substrate to the periphery of the semiconductor substrate. Furthermore, the fluid is more deteriorated in a closer portion of the semiconductor substrate to the periphery of the semiconductor substrate, compared to the state of the fluid right after the fluid is discharged. Thus, it is difficult to uniformly perform processing in the semiconductor substrate.

A single-wafer-processing substrate processing apparatus for solving this problem has been proposed in Japanese Laid-Open Publication No. 2002-151455. Hereinafter, the single-wafer-processing substrate processing apparatus will be described with reference to the accompanying drawings.

FIG. 13 is a view schematically illustrating the structure of a known single-wafer-processing substrate processing apparatus using a fluid.

A rotation table 11 is provided in a processing chamber 10. The rotation table 11 is connected to a driving section 12 so as to be rotated due to a rotation operation of the driving section 12.

A silicon substrate 13 is provided on the rotation table 11 and is rotated with the rotation table 11.

A fluid supply nozzle 14 provided in an upper portion of the processing chamber 10 supplies a fluid 15 onto a silicon substrate 13, and the angle, direction and the like of the fluid supply nozzle 14 are controlled by a nozzle adjustment mechanism 16. In this case, the fluid 15 is a liquid such as a chemical solution, pure water and the like.

Moreover, the fluid 15 is supplied to the fluid supply nozzle 14 by a pump system 17, and the pump system 17 and the nozzle adjustment mechanism 16 are controlled by a control system 18. Thus, the flow rate or the like of the fluid 15 supplied onto the silicon substrate 13 is controlled according to processing so as to be an optimum level.

The fluid 15 used in processing of the silicon substrate 13 is discharged from the processing chamber 10 through a waste fluid discharge drain 19.

Such processing by the above-described processing apparatus is performed, with the silicon substrate 13 provided on the rotation table 11, by supplying the fluid 15 onto the silicon substrate 13 by the fluid supply nozzle 14 while rotating the silicon substrate 13.

The substrate processing apparatus of FIG. 13 uses the arrangement of fluid supply nozzles 14 for making processing in a plane of the silicon substrate 13 uniform. FIG. 14 is a plan view illustrating an example of the arrangement.

As shown in FIG. 14, assume that a position A is located in the vicinity of the center of the silicon substrate 13, a position B is located in a closer portion of the silicon substrate 13 to the periphery thereof than the position A, and a position C is located in a closer portion of the substrate 13 to the periphery thereof than the point B. In this case, a fluid supply nozzle 14a for supplying the fluid 15 to the position A, two fluid supply nozzles 14b for supplying the fluid 15 to the position B, four fluid supply nozzles 14c for supplying the fluid 15 to the position C are provided. That is, seven fluid supply nozzles 14 are used for total and are arranged so that more fluid supply nozzles are provided in a closer portion of the semiconductor substrate 13 to the periphery.

Thus, the flow rate of the fluid 15 in a peripheral portion of the silicon substrate 13 can be increased, so that the fluid can be uniformly supplied to the entire silicon substrate 13.

In addition to the above-described points, the nozzle adjustment mechanism 14 and the pump system 17 are controlled by the control system 18, so that a direction and an angle in which the fluid supply nozzle 14 discharges the fluid 15 and the flow rate of the fluid 15 and the like are set so as to be optimized according to processing to be performed to the silicon substrate 13.

Thus, when the silicon substrate 13 provided on the rotation table 11 is rotated and the fluid 15 is supplied from the seven fluid supply nozzles 14, the fluid 15 which is not deteriorated can be supplied over an entire surface of the silicon substrate 13. As a result, non-uniformness of processing performed to the silicon substrate 13 in a plane can be reduced.

Note that as a fluid supply nozzle in the known substrate processing apparatus, in general, a simple pipe is used.

Moreover, another example of processing apparatuses for performing uniform processing of an entire substrate is, for example, an apparatus disclosed in Japanese Laid-Open Publication No. 2001-68449.

According to the Japanese Laid-Open Publication No. 2001-68449, a plurality of fluid supply nozzles and a plurality of fluid recovery nozzles are arranged so that the entire surface of the silicon substrate 13 can be covered.

SUMMARY OF THE INVENTION

However, in the above-described substrate processing apparatus, with increase in the diameter of a substrate, the number of nozzles is increased. Accordingly, the structure of the apparatus becomes complicated and more parameters have to be controlled for fluid discharge. As a result, a very long time is required for determining optimum conditions for substrate processing. Moreover, with a complicated apparatus structure, when the problem of generation of particles arises in a fluid supply nozzle, a fluid supply pipe or the like, it is difficult to find what part causes the problem.

Furthermore, in a fluid processing step, there are many cases where fluid processing with a plurality of fluids is continuously performed. In the known substrate processing apparatus, to continuously perform processing using different fluids, separate fluid supply nozzles for supplying different fluids, respectively, are provided. As a result, very many fluid supply nozzles are disposed in the apparatus, so that a time required for determining parameters under optimum conditions is increased furthermore and also a maintenance operation becomes very complicated.

Moreover, when a fluid is supplied using a fluid supply nozzle with a known structure, i.e., a simple pipe, in general, there might be cases where substrate processing becomes non-uniform depending on areas of the substrate even with use of a processing method in which a plurality of fluid supply nozzles are used. This is because on the substrate, there exist both of an area which the fluid discharged from a fluid supply nozzle directly hits and an area which is brought into contact with the fluid due to a flow of the fluid from the area.

Moreover, in order to improve processing efficiency, processing speed, uniformity in processing and the like, it is preferable to increase the flow rate of a fluid (for this purpose, discharge pressure to be applied to the fluid is increased, for example) and also increase the rotation speed of the substrate. Thus, a fluid exchange speed at which a fluid is exchanged with another fluid on the substrate (i.e., fluid exchangeability or removal rate) is increased.

However, when the flow rate of a fluid is increased, a physical impact at a time when the discharged fluid is brought into contact with a substrate is increased, so that damages on the substrate such as fall or peeling of a pattern formed on the substrate given are caused.

Furthermore, for example, when cleaning of a substrate (such as a wafer) using ultra-pure water or the like is performed, there might be cases where electric charges are generated due to friction of the rotating substrate and ultra-pure water and stored in the substrate, so that an electric filed is generated in the substrate. When such an electric filed is increased and a voltage exceeding an insulating breakdown voltage of an insulating film or the like formed in the substrate, a pattern formed in the substrate is destroyed. In this case, if the rotation speed of the substrate is high or the discharge pressure of the fluid is high (i.e., the flow rate of the fluid is large), the substrate is easily charged and thus a pattern is destroyed in many cases. To ease this phenomenon, $CO_2$ is added to ultra-pure water so as to reduce a resistivity of ultra-pure water, or other measures are taken. However, in that case, the same problem might arise depending on the rotation speed of the substrate and the discharge pressure of the fluid.

In view of the above-described problems, it is an object of the present invention to provide a substrate processing method which allows simplification of an apparatus structure, improvement of efficiency, speed and uniformity of substrate processing and reduction in damages, a fluid supply nozzle usable in the method, and a substrate processing apparatus including the fluid supply nozzle.

To achieve the object, a fluid supply nozzle according to the present invention includes: a fluid flow-in section into which a fluid flows in; a reservoir section, connected to the fluid flow-in section, for storing the fluid; a flow velocity control wall provided between the fluid flow-in section and the reservoir section and including an orifice for passing the fluid therethrough while reducing a flow velocity; and a discharging section connected to the reservoir section and including a slit for discharging the fluid with pressure of the fluid which has passed through the orifice.

With the fluid supply nozzle of the present invention, a fluid which has flowed in the fluid flow-in section passes through the orifice of the flow velocity control wall, so that the fluid moves to the reservoir section with a reduced flow velocity. Thus, in the reservoir section, pressure of the fluid at a flow velocity when the fluid flows in the reservoir section is not directly applied, but pressure of the fluid at a flow velocity controlled by the flow velocity control wall is uniformly applied. Thus, a fluid is discharged from the slit of the discharging section with uniform pressure, so that the fluid is discharged in a film shape and the flow rate of the fluid is uniform at each part of the film shape when the fluid is discharged.

It is preferable that the slit has an opening plane with the ratio of a length of the slit to a width of the slit is 10 or more.

Thus, a fluid can be reliably supplied in a film shape. In this case, the slit has an opening plane, for example, with a rectangular shape. A dimension of a long side thereof is referred to as a "length" and a dimension of a short side thereof is referred to as a "width". Even when the opening plane has some other shape than a rectangular shape, a longer dimension is referred to as a "length" and a shorter dimension is referred to as a "width". Also, the opening plane means to be a plane at an end of the slit located in an opposing side to the reservoir section.

Moreover, it is preferable that a cross section of the reservoir section taken along the perpendicular direction to the length direction of the opening plane of the slit has a shape with part expanding toward an opposing side to the flow velocity control wall with respect to a straight line joining a contact point between an inner wall of the reservoir section and the flow velocity control wall and a contact point between the inner wall of the reservoir section and the slit.

Thus, the reservoir section can store a sufficiently large volume of a fluid. Accordingly, in the reservoir section, pressure is reliably applied in a uniform manner, so that the fluid can be discharged in a film shape with a uniform flow rate at each part of the film shape when the fluid is discharged.

Moreover, it is preferable that a cross section of the reservoir section taken along the perpendicular direction to the length direction of the opening plane of the slit has a shape with part bulging toward an opposing side to the flow velocity control wall with respect to a line joining a contact point between an inner wall of the reservoir section and the flow velocity control wall and a contact point between the inner wall of the reservoir section and the slit.

Thus, the reservoir section can store a sufficiently large volume of a fluid. Accordingly, in the reservoir section, pressure is reliably applied in a uniform manner. In addition to this, an inner wall of the reservoir section is curved, so that the fluid smoothly flows. Therefore, the fluid can be discharged in a film shape with a uniform flow rate at each part of the film shape when the fluid is discharged and the flow rate of the fluid can be increased furthermore.

Moreover, it is preferable that the fluid is discharged through the slit in the direction making an angle with a center axis of the fluid supply nozzle.

Thus, the direction in which the fluid supply nozzle is disposed and the direction in which a fluid is discharged can be set separately. Therefore, when the fluid supply nozzle is provided in a substrate processing apparatus and used, the degree of flexibility in design of the substrate processing apparatus is improved.

To achieve the above-described object, a substrate processing apparatus according to the present invention includes: the fluid supply nozzle of the present invention; and a flow rate control section for controlling a flow rate of a fluid flowing into the fluid supply nozzle. In the substrate processing apparatus, the fluid is supplied from the fluid supply nozzle to the substrate, and the length direction of an opening of the slit is substantially parallel to the substrate.

With the substrate processing apparatus, a fluid can be supplied to a substrate or the like as a subject to be processed so as to have a continuous film shape with a uniform flow rate of the fluid at each part of a contact area when the fluid is brought into contact with the substrate. A first reason for this is that when a fluid is discharged using the fluid supply nozzle of the present invention, the fluid is discharged in a film shape and the flow rate of the fluid is uniform at each part of the film shape. In addition to this, the slit is formed so that the length direction of the opening plane of the slit is parallel to the substrate. Thus, the flow rate of the fluid (a volume of a supplied fluid per unit time and unit area) becomes uniform at each part when the substrate and the fluid are brought into contact with each other.

Moreover, compared to the case where a known fluid supply nozzle, i.e., a simple pipe is used, with a single fluid supply nozzle according to the present invention, a fluid can be supplied in a wide range.

Based on the above-described results, with the substrate processing apparatus of the present invention, the following effects can be achieved.

By discharging a fluid in a film shape, the fluid can be supplied in a wide range. Thus, even with a substrate having a large diameter, it is not necessary to increase the number of fluid supply nozzles. Therefore, increase in complexity of the structure of the substrate processing apparatus can be prevented.

Moreover, a fluid can be supplied onto a substrate as a film with a uniform flow rate at each part of the film. Therefore, it can be prevented that processing of a substrate becomes non-uniform depending on areas of the substrate.

Moreover, only a small physical impact is caused by a fluid supplied in a uniform film shape when the fluid falls onto a substrate. Thus, damages such as fall or peeling of a pattern formed on the substrate can be reduced. Furthermore, when processing using ultra-pure water or the like is performed, with such a small physical impact, only small static electricity is generated. Therefore, destruction of a pattern formed in the substrate due to electric charges generated in the substrate can be prevented.

Moreover, compared to the case where a fluid is supplied by the known fluid supply nozzle, the flow rate of the supplied fluid can be increased while damages on the substrate are suppressed. Therefore, fluid exchangeability is increased and thus processing efficiency and processing speed can be improved.

Note that the length direction of the slit opening plane may be substantially parallel to the substrate, i.e., it is not required that the length direction of the slit opening plane is parallel to the substrate in a strict sense. In other words, even with the length direction of the slit opening plane not precisely parallel to the substrate, if effects of the present invention such as uniformity in processing can be achieved to a required extent, the length direction and the substrate are considered to be substantially parallel.

To achieve the above-described object, a substrate processing method according to the present invention is a substrate processing method in which a fluid is supplied onto a substrate to perform processing of the substrate. In the substrate processing method, the fluid is supplied in a continuous film shape to the substrate, and when the fluid is in contact with the substrate, a flow rate of the fluid is uniform at each part of a contact area of the substrate with the fluid.

According to the substrate processing method of the present invention, a fluid is supplied in a continuous film shape with a uniform flow rate at each part of a contact area when the fluid is brought into contact with the substrate. Thus, as described in the description of the substrate processing apparatus of the present invention, uniform processing causing less damages can be efficiently performed to the entire substrate.

It is preferable that a fluid is discharged to a substrate using the fluid supply nozzle of the present invention.

Thus, the fluid is reliably supplied in a continuous film shape and the flow rate of the fluid at each part of a contact area when the fluid is brought into contact with the substrate becomes uniform. Therefore, the effects of the present invention can be reliably achieved.

Moreover, it is preferable that a pattern having a width of 0.13 μm or less and an aspect ratio of 2.5 or more is formed on the substrate.

With such a pattern formed on the substrate, the substrate can be processed while damages on the pattern are reduced, i.e., an effect of the present invention can be reliably achieved.

As has been described, with use of the fluid supply nozzle of the present invention, a fluid can be discharged in a film shape and the flow rate of the fluid becomes uniform at each part of the film shape when the fluid is discharged. When a substrate is processed with a fluid supplied in the above-described manner, uniform processing can be performed to the entire substrate. Moreover, the flow rate of the fluid can be increased while a physical impact caused when the fluid is brought into contact with the substrate is suppressed. Thus, efficiency of substrate processing can be improved while physical damages on a pattern formed on the substrate and damages due to generated electric charges are suppressed. Furthermore, with a single fluid supply nozzle, a fluid can be supplied in a wide range. Thus, the number of fluid supply nozzles required for processing a substrate with a large diameter may be small. For example, the number of fluid supply nozzles may be one. Accordingly, the structure of a substrate processing apparatus using the fluid supply nozzle of the present invention can be simplified.

The present invention is useful for processing of a substrate or the like using a fluid and, more particularly, is useful for processing of a silicon substrate with a large diameter, a flat display panel and the like.

BRIEF DESCRIPTION OF THE DRAWINGS

FIG. 1 is a view illustrating an exemplary appearance of a fluid supply nozzle according to a first embodiment of the present invention.

FIG. 2A is a horizontal cross-sectional view of the fluid supply nozzle; FIG. 2B is a vertical cross-sectional view of the fluid supply nozzle; and FIG. 2C is a view illustrating cross-sectional shapes of a discharging section 104 and a slit 105.

FIG. 4 is an illustration showing the relationship between fluid flow rate and fluid discharge shape for the case where a fluid is discharged using the fluid supply nozzle of the first embodiment of the present invention.

FIG. 10A is a horizontal cross-sectional view of the fluid supply nozzle; FIG. 10B is a vertical cross-sectional view of the fluid supply nozzle; and FIG. 10C is a view illustrating cross-sectional shapes of a discharging section 104 and a slit 105.

FIG. 11A is a horizontal cross-sectional view of the fluid supply nozzle; FIG. 11B is a vertical cross-sectional view of the fluid supply nozzle; and FIG. 11C is a view illustrating cross-sectional shapes of a discharging section 104 and a slit 105.

FIG. 14 is a plan view describing a known substrate processing method using a plurality of fluid supply nozzles.

DESCRIPTION OF THE PREFERRED EMBODIMENTS

Hereinafter, embodiments of the present invention will be described with reference to the accompanying drawings. Note that as a fluid, for example, a liquid such as an etchant and pure water used in processing of a substrate is considered. However, the present invention is not limited thereto.

First Embodiment

FIG. 1 is a view illustrating the appearance of a fluid supply nozzle 100 according to a first embodiment of the present invention.

Figure 2A:
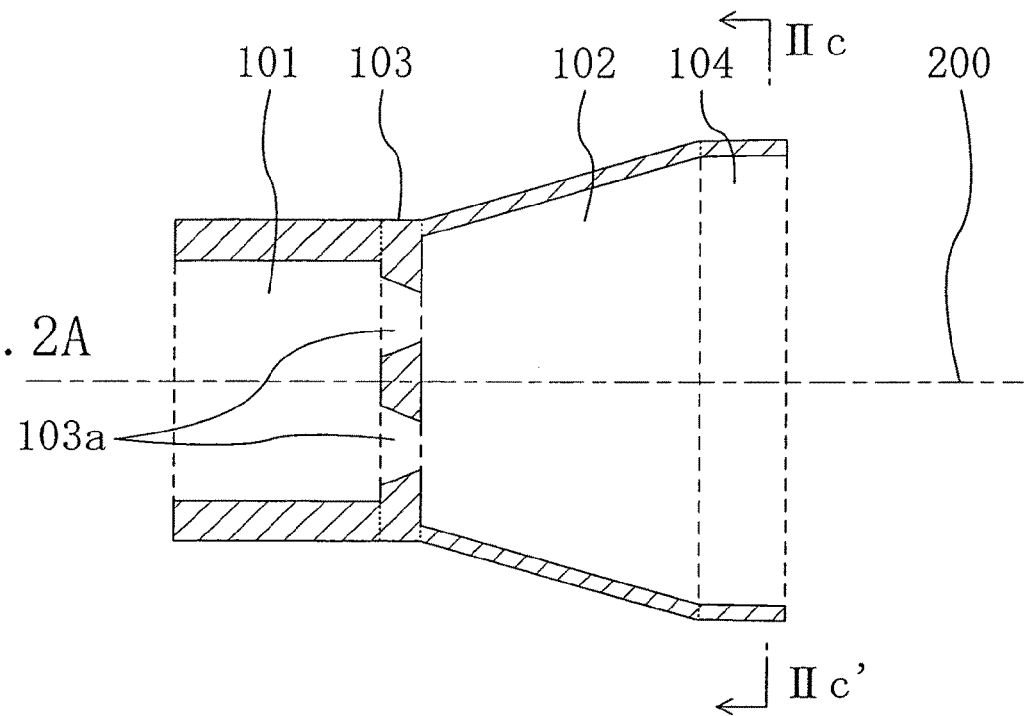
FIGS. 2A, 2B and 2C are cross-sectional views schematically illustrating the fluid supply nozzle of the first embodiment of the present invention.
Figure 2B:
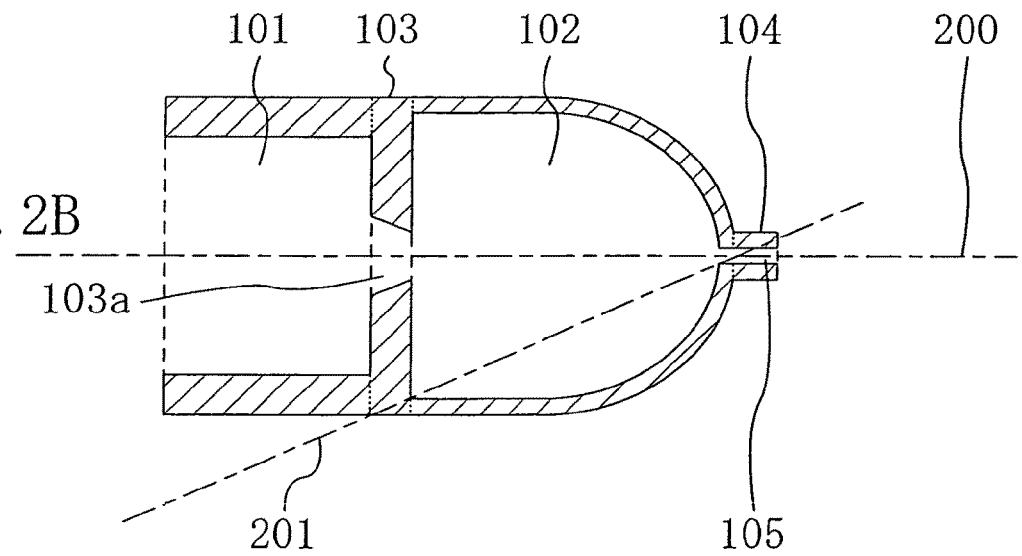

Moreover, FIG. 2A is a view illustrating a cross section (which will be hereinafter referred to as a "horizontal cross section") taken along the line IIa-IIa' of FIG. 1 and FIG. 2B is a view illustrating a cross section (which will be hereinafter referred to as a "vertical cross section") taken along the line IIb-IIb' of FIG. 1.

As shown in FIG. 1 and FIGS. 2A and 2B, a fluid supply nozzle 100 includes a fluid flow-in section 101, a reservoir section 102 for storing a fluid flowing in the fluid flow-in section 101, a flow velocity control wall 103 (not shown in FIG. 1) provided between the fluid flow-in section 101 and the reservoir section 102, and a discharging section 104 connected to the reservoir section 102. The flow velocity control wall 103 has a flat plate shape and includes an orifice 103a for passing a fluid therethrough while reducing a flow velocity of the fluid. The orifice 103a has a truncated cone shape of which a portion located in the reservoir portion 102 side has a smaller diameter.

In this case, a straight line which passes through the center of the flow velocity control wall 103 and is perpendicular to the flow velocity wall 103 is referred to as a "center axis 200".

Moreover, the discharging section 104 includes a slit 105 for discharging a fluid. As shown in FIG. 2B, the slit 105 extends so that the direction from a side of the slit 105 in contact with the reservoir section 102 to a tip (which will be hereinafter referred to as an "opening plane") of the slit 105 located in an opposing side of the slit 105 is parallel to the center axis 200.

In each of the horizontal cross-sectional view of FIG. 2A and the vertical cross-sectional view of FIG. 2B, the fluid flow-in section 101, the reservoir section 102, the flow velocity control wall 103 and the discharging section 104 are divided by dotted lines. However, these constituent elements may be united as one. In that case, structurally, boundary lines, i.e., dotted lines do not clearly exist.

Figure 2C:
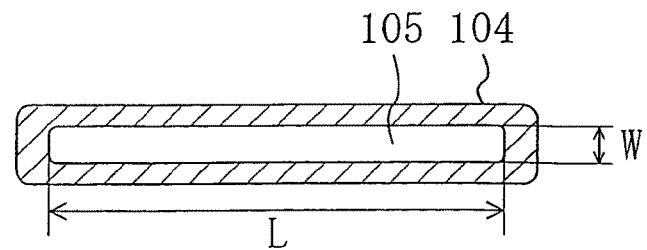

FIG. 2C is a cross-sectional view taken along the line IIc-IIc' of FIG. 2A. In FIG. 2C, a cross-sectional shape of the discharging section 104 and the slit 105 are shown. In this embodiment, the slit 105 has a rectangular cross section with its corner rounded. Moreover, a dimension of a long side indicated by L regardless of corners being rounded is considered to be the length and a dimension of a short side indicated by W regardless of corners being rounded is considered to be the width.

Moreover, as shown in FIG. 2B, the reservoir section 102 has a shape with part bulging outward (toward an opposing side to the flow velocity control wall 103) with respect to a straight line 201 joining a contact point between the reservoir section 102 and the flow velocity control wall 103. With this shape, a sufficient volume of a fluid can be stored in the reservoir section 102 and a fluid which has been flown in the fluid reservoir section 102 through the orifice 103a can smoothly flow to reach the discharging section 104.

Note that the horizontal cross section includes the center axis 200 and is a plane parallel to the length direction of the opening plane of the slit 105. The vertical cross section includes the center axis 200 and is a plane orthogonal to the horizontal cross section.

Hereinafter, discharge of a fluid using the fluid supply nozzle 100 with the above-described structure will be described with reference to the accompanying drawings.

Figure 3A:
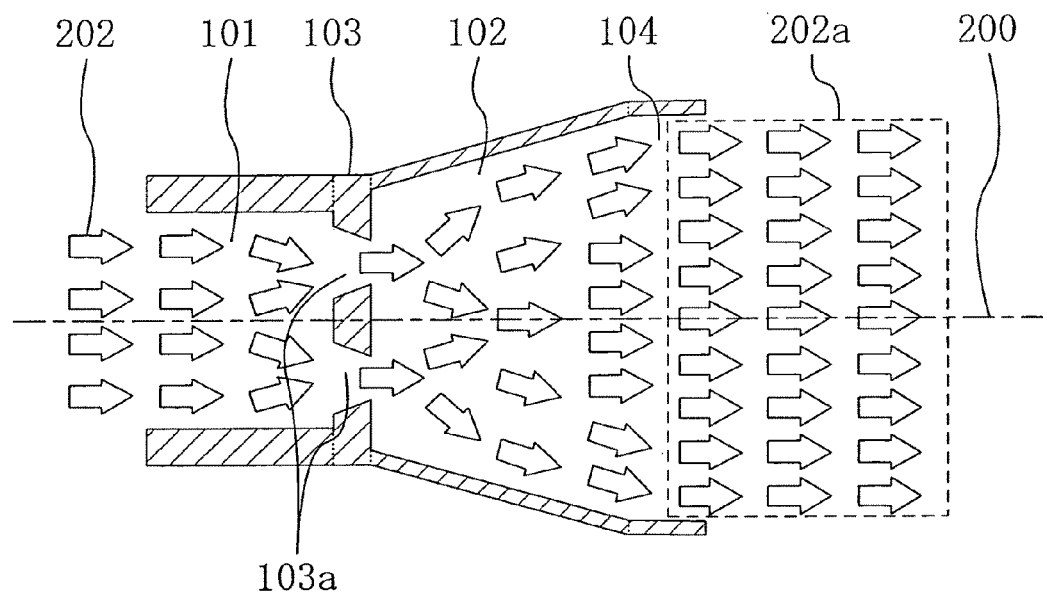
FIG. 3A is a cross-sectional view illustrating how a fluid is discharged with the fluid supply nozzle of the first embodiment of the present invention.
Figure 3B:
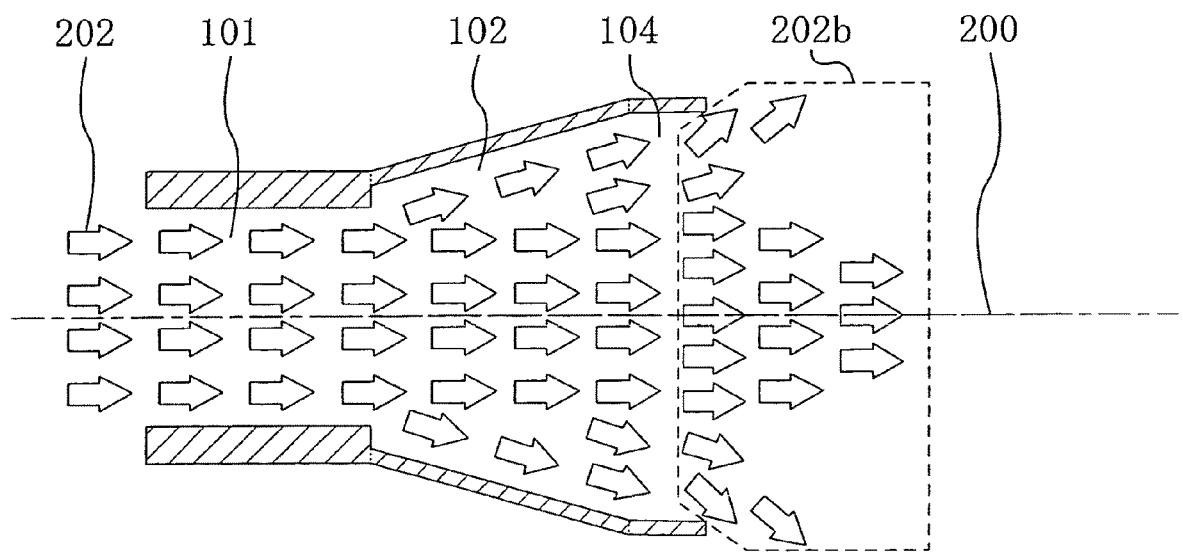
FIG. 3B is a cross-sectional view illustrating how a fluid is discharged with a comparative fluid supply nozzle which does not include a flow velocity control wall 103.

FIG. 3A is a cross-sectional view taken along the line IIa-IIa' of FIG. 1, i.e., the same cross-sectional view of FIG. 2A and schematically illustrating a flow of a fluid when the fluid is discharged using the fluid supply nozzle 100 of the present invention. Moreover, FIG. 3B is a cross-sectional view schematically illustrating a flow of a fluid when the fluid is discharged using a comparative fluid supply nozzle 100b for comparison. The comparative fluid supply nozzle 100b has a similar structure to that of the fluid supply nozzle 100, but in the structure of the comparative fluid supply nozzle 100b, the flow velocity control wall 103 is not provided and the fluid flow-in section 101 and the reservoir section 102 are directly connected to each other.

When the fluid supply nozzle 100 of this embodiment is used, as shown in FIG. 3A, a fluid flows into the fluid flow-in section 101 as if the fluid followed arrows 202. Thereafter, the fluid passes through the orifice 103a provided in the flow velocity control wall 103, so that the flow velocity of the fluid is reduced and the fluid moves to the reservoir section 102 to be stored in the reservoir section 102.

With the width of the slit 105 sufficiently narrowed, the reservoir section 102 can be substantially sealed. When the reservoir section 102 is filled with the fluid in this manner, the fluid in the reservoir section 102 receives uniform pressure from the fluid flowing therein through the orifice 103a. With this uniform pressure, as arrays of arrows 202a in FIG. 3A show, the fluid is discharged in a single-layered, continuous film shape.

The discharged fluid keeps a stable certain shape and falls in the air. At this point of time, the shape made by the fluid is a single-layered, thin film according to the cross sectional shape of the slit 105 and the film made by a flow of the fluid is maintained without being disturbed until the fluid falls for a certain distance. For example, when substrate processing is performed, a fluid film can be maintained until the discharged fluid falls onto the substrate. Moreover, by continuously supplying a fluid to the flow supply nozzle 100, the fluid can be continuously discharged in a film shape while disturbance or interruption of the shape is prevented. This is what is meant by "a fluid is discharged in a single-layered, continuous film shape".

In this case, at a discharge plane, the volume of a fluid per unit area and unit time is uniform.

In contrast, the case where a fluid is discharged using a comparative fluid supply nozzle 100b will be hereinafter described.

As shown in FIG. 3B, a fluid flows in the fluid flow-in section 101 according to the arrows 202. This is the same as in the case where the fluid supply nozzle 100 of FIG. 3A is used.

However, in the comparative flow supply nozzle 100b, the flow velocity control wall 103 is not provided and thus the fluid moves to the reservoir section 102 with a flow velocity at a time when the fluid flows in the fluid flow-in section 101 substantially maintained as it is.

In this case, to describe the shape of the reservoir section 102, a cross section of a closer portion thereof to the fluid flow-in section 101 has a circular cross section and a closer portion thereof to the discharging section 104 has an oblate shape. Thus, when the flow rate of a fluid supplied to the fluid flow-in section 101 is too large (in other words, the flow velocity thereof is too high), pressure to the fluid filled into the reservoir section 102 becomes non-uniform. That is, pressure in the vicinity of the center of the slit 105 (i.e., in the vicinity of the center axis 200) is different from pressure in the vicinity of each of both ends of the slit 105 (i.e., at a distant point from the center axis 200). As a result, the fluid discharged from the slit 105 of the comparative fluid supply nozzle 100b can not maintain the same cross-sectional shape as that of the cross-sectional shape of the slit 105. Specifically, as arrays of arrows 202b in FIG. 3B shows, right after the fluid is discharged from the discharging section 104, the fluid is separated at both ends and the center of the slit 105 and thus the fluid can not be discharged as a single-layered film. Therefore, at a discharge plane, the flow rate of a fluid per unit area and unit time is not uniform.

As has been described, the fluid supply nozzle 100 of this embodiment includes the discharging section 104 with the slit 105 having a small width, the reservoir section 102 having a shape with part expanding outward (toward an opposing side to the flow velocity control wall 103) and being capable of storing a sufficient volume of a fluid, and the flow velocity control wall 103 including the orifice 103a for passing a fluid therethrough while reducing the flow velocity of the fluid. Thus, the fluid supply nozzle 100 can discharge a fluid in a single-layered film shape.

Note that in the fluid supply nozzle 100 of this embodiment, for example, the fluid flow-in section 101 may have a circular cross-sectional shape with an inner diameter of 25 mm and the flow velocity control wall 103 may have a thickness of 10 mm. Moreover, the orifice 103a may be formed so as to have a cross section with an inner diameter of 5 mm at the fluid flow-in section 101 side and a cross section with an inner diameter of 4 mm at the reservoir section 102 side.

Moreover, the length from a contact point between the discharging section 104 and the reservoir section 102 to the tip of the discharging section 104 is 5 mm, and the cross-sectional shape of the discharging section 104 of FIG. 2C has a length of 53 mm and a thickness of 1.5 mm. The width of the slit 105 is 0.7 mm.

The above-described dimensions are examples for suitable dimensions to be used in the case where a silicon substrate with a diameter of 200 mm is processed. Not only the above-described values but also other values may be set for the dimensions according to a required flow rate of a fluid, an easiness level in forming the fluid supply nozzle 100 and the like.

Moreover, as for the cross-sectional shape of the slit 105, for example, if a rectangular shape having a width of not less than 0.5 mm and not more than 1 mm is used and the ratio of the length of the cross-sectional shape to the width thereof is set to be 10 or more, the effect of discharging a fluid in a film shape can be reliably achieved. Moreover, the reservoir section 102 is preferably formed so as to be capable of storing a sufficient volume of a fluid. Thus, the reservoir section 102 has a shape with part expanding outward (toward an opposing side to the flow velocity control wall 103) with respect to a straight line 201.

Moreover, in this embodiment, the fluid supply nozzle 100 may be integrally formed. As another option, the fluid supply nozzle 100 may be formed so as to have the shape shown in each of FIGS. 1A through 1C and FIGS. 2A through 2C by forming the fluid supply nozzle 100 into a plurality of arbitrary divided components and then combining the divided components. In such a case, an O ring for preventing a leak of a fluid may be buried in each connection section between components, or some other measure may be taken.

Moreover, in this embodiment, the slit 105 has a cross section having a rectangular shape with its corners rounded. However, the shape of the slit 105 is not limited thereto. For example, the slit 105 may have a cross-section with a rectangular shape of which corners are not rounded, or the slit 105 may be a slit with a cross section curved in an arc shape and an opening plane also curved in an arc shape.

Moreover, in this embodiment, two orifices 103a each having a truncated cone shape are provided in the flow velocity control wall 103. However, this is not essential. Each of the orifices 103a may be formed in any way as long as the flow velocity of a fluid is controlled so that the fluid is discharged in a film shape and uniform pressure is applied to the reservoir section 102. To achieve this, for example, a structure in which pressure of the fluid flowing into the fluid flow-in section 101 is applied to the fluid filled into the reservoir section 102 from one portion of the flow velocity wall 103 can be formed. Then, the number of orifices, the shape thereof and the like may be designed according to the type of a fluid and a required flow rate and the like.

Furthermore, the flow velocity control wall 103 is formed so as to have a flat plate shape. However, the flow velocity control wall 103 is not limited thereto.

Moreover, as for a material for the fluid supply nozzle 100, properties such as chemical resistance according to the type of a fluid to be discharged is selected, for example, to prevent a silicon substrate to be processed from being contaminated with an impurity. For example, fluoroplastic, stainless steel or the like can be used.

Moreover, in the case where a silicon substrate with a flat surface is processed, for example, after CMP (chemical mechanical polishing) has been performed, or in like case, it is also preferable to provide a mesh or the like in the vicinity of a connection portion between the reservoir section 102 and the discharging section 104. Thus, bubbles can be generated and made to be in a discharged fluid, so that a physical impact on a substrate can be eased furthermore. Accordingly, damages on the substrate can be prevented and also the volume of the discharged fluid can be increased furthermore.

Next, the relationship between the volume of a fluid to be supplied to the fluid supply nozzle 100 of this embodiment and the shape of a discharged fluid from the slit 105 will be described with reference to FIG. 4.

FIG. 4 is an illustration showing how the fluid supply nozzle 100 is disposed so that the slit 105 is horizontally located and discharges a fluid. Specifically, since the direction from part of the slit 105 connected to the reservoir section 102 to the opening plane of the slit 105 is parallel to the central axis 200, the fluid supply nozzle 100 of this embodiment is disposed so that each of the center axis 200 and the length direction of the opening plane of the slit 105 horizontally extends.

Moreover, the discharged fluid falls, for example, onto a silicon substrate horizontally disposed and then the silicon substrate is processed with the fluid. At this time, the silicon substrate is rotated.

First, the case where a fluid flows at a proper fluid flow rate, indicated by (B) of FIG. 4, will be described.

In this case, a proper flow rate of a fluid flows in the fluid supply nozzle 100. Specifically, if the fluid supply nozzle 100 has proper dimensions for processing a silicon substrate with a diameter of 200 mm as has been described, the proper flow rate of a fluid is, for example, the range of 10-20 l/min.

Then, in the vicinity of each of the center axis 200 and end potions of the discharging section 104, the flow velocity at a time of discharge is the same and the fluid is discharged in a single-layered, continuous film shape. Thereafter, being maintained in a film shape, the fluid falls onto the silicon substrate at a certain distance from the discharging section 104.

Thus, when observed from the top, the discharged fluid has a square shape. Also, when observed from a lateral view, the fluid falls onto the silicon substrate to describe a curve, i.e., a substantially circular arc. Moreover, at each part of a contact area where a single-layered film of the fluid is in contact with the silicon substrate, the flow rate of the fluid is uniform. That is, at any part of the contact area, the volume of a fluid supply per unit area and unit time is the same.

In contrast, the case where a fluid flows at an insufficient fluid flow rate, indicated by (A) of FIG. 4, will be described next.

In this case, the flow rate of the fluid for the fluid supply nozzle 100 is insufficient. In the case where the same fluid supply nozzle 100 as that described above is used, the flow rate is, for example, 10 l/min. or less.

In this situation, the fluid can not be discharged by uniform pressure applied to the fluid in the reservoir section 102 and the fluid is discharged nearly in a leakage state.

Specifically, the fluid has a film shape right after being discharged from the discharging section 104 but as the fluid falls, the fluid can not maintain the film shape. When observed from the top, the fluid has a convex shape with a more flow rate in the vicinity of the center axis 200 than in the vicinity of each end portion. When observed from a lateral view, the fluid does not have a single line shape but falls such that the fluid spreads to a certain distance from a point nearly right under the discharging section 104. As a result, the fluid falls non-uniformly onto the substrate. Furthermore, in this case, although the flow rate of the fluid is smaller than in that in the proper flow rate case of (B), part of the fluid falls as fluid drops onto the substrate and thus a physical impact of the fluid on the substrate might be partially larger than in the case of (B).

Next, the case where a fluid flows at an excessive fluid flow rate, indicated by (C) of FIG. 4, will be described.

In this case, the flow rate of the fluid for the fluid supply nozzle 100 is excessive. In the case where the same fluid supply nozzle 100 as that described above is used, the flow rate is, for example, 20 l/min. or more.

In this situation, the flow rate is excessive and the flow velocity of the fluid can not be sufficiently reduced by the flow velocity control wall 103, so that excessive pressure is applied to the fluid in the reservoir section 102. Accordingly, the fluid can not be discharged from the slit 105 by uniform pressure.

Specifically, the flow rate is larger in the vicinity of each of the end portions of the slit 105 than in the vicinity of the center axis 200 and, when observed from the top, the discharged fluid has a concave shape. Also, when observed from a lateral view, the discharged fluid does not have a single line shape but falls such that the fluid spreads within a certain range extending to a point at a large distance from a point nearly right under the discharging section 104. As a result, at each part of a contact area where the fluid falls to be in contact with the substrate, the flow rate of the fluid is not constant.

As has been described, if a fluid is supplied at a proper flow rate to the fluid supply nozzle 100 of this embodiment, the fluid can be discharged uniformly in a single-layered film shape.

Now, as one of objectives for performing fluid processing to a silicon substrate, removal of particles from a silicon substrate will be considered. In particle removal, regardless of the shape of a discharged fluid, as the flow rate of the fluid is larger, the particle removal rate per unit time is increased.

However, with increase in the flow rate, a pattern formed on the silicon substrate is damaged more easily. Particularly, a pattern with a high aspect ratio is easily damaged. With an increased flow rate, pressure of the fluid applied to the silicon substrate is increased. As a result, a formed pattern falls or is peeled from the silicon substrate, or other damages are caused.

Figure 5A:
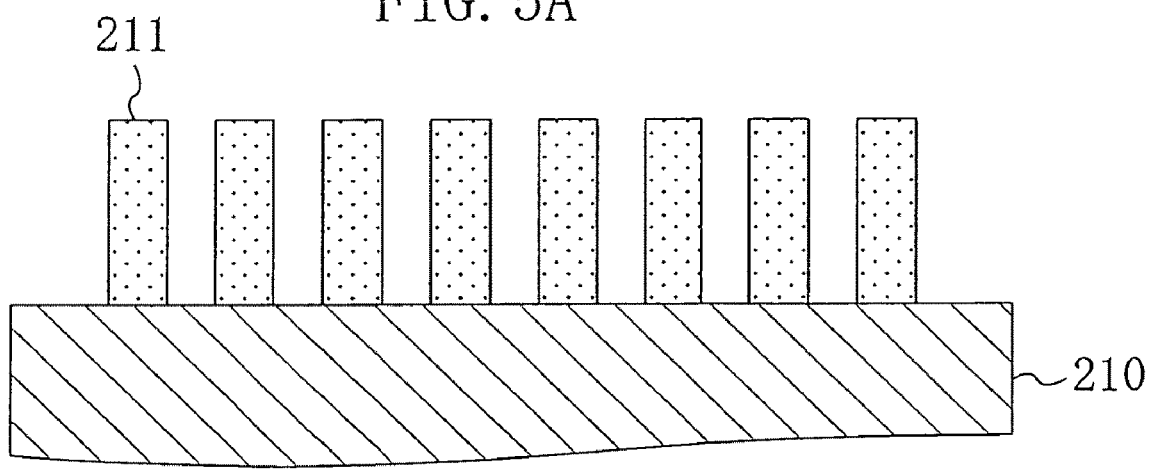
FIG. 5A is a view schematically illustrating normal line patterns formed on a silicon substrate.

FIG. 5A is a cross-sectional view of line patterns 211 formed at high density on a silicon substrate 210. In this case, each of the line patterns 211 has, for example, a width of 0.13 μm and an aspect ratio of 3. FIG. 5A shows the line patterns 211 formed in a normal state. If fluid processing is performed under proper conditions including a proper flow rate, the line patterns 211 in a normal state can be maintained even after the processing.

Figure 5B:
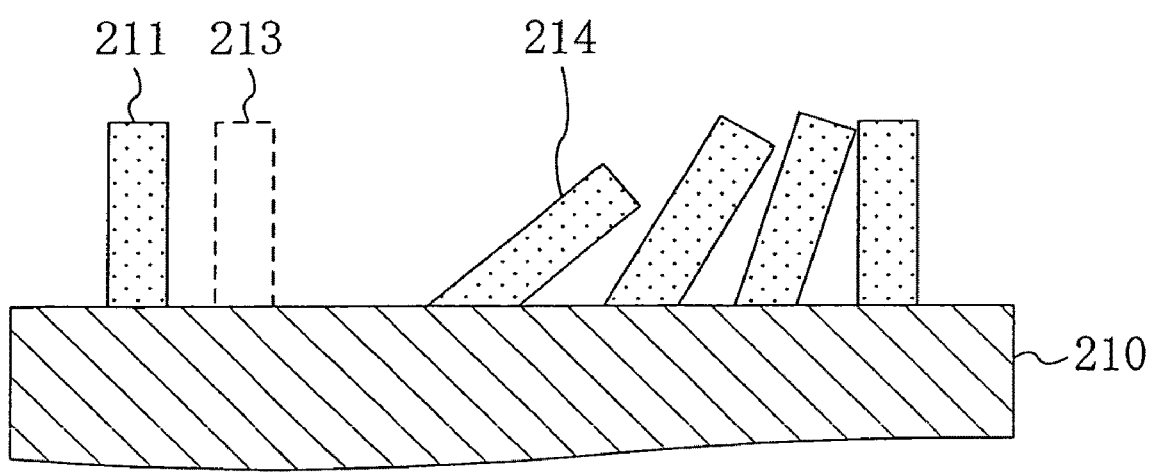
FIG. 5B is a view schematically illustrating line patterns damaged due to fluid processing.

In contrast, when the flow rate of the fluid is excessive, pressure applied to the silicon substrate by the fluid is increased in an area of the silicon substrate with which the fluid is in contact and the like, so that the line patterns 211 are damaged as shown in FIG. 5B. For example, some of the line patterns 211 might be peeled and lost from the silicon substrate 210 as shown by 213 or some of the line patterns might fall as shown by 214. Specifically, when the width of each line pattern is 0.13 μm or less, the line patterns are easily damaged.

The occurrence of such damages causes defects of a semiconductor device to be fabricated.

Next, the flow rate of a fluid, a particle removal rate and a pattern destruction rate will be described.

Figure 6:
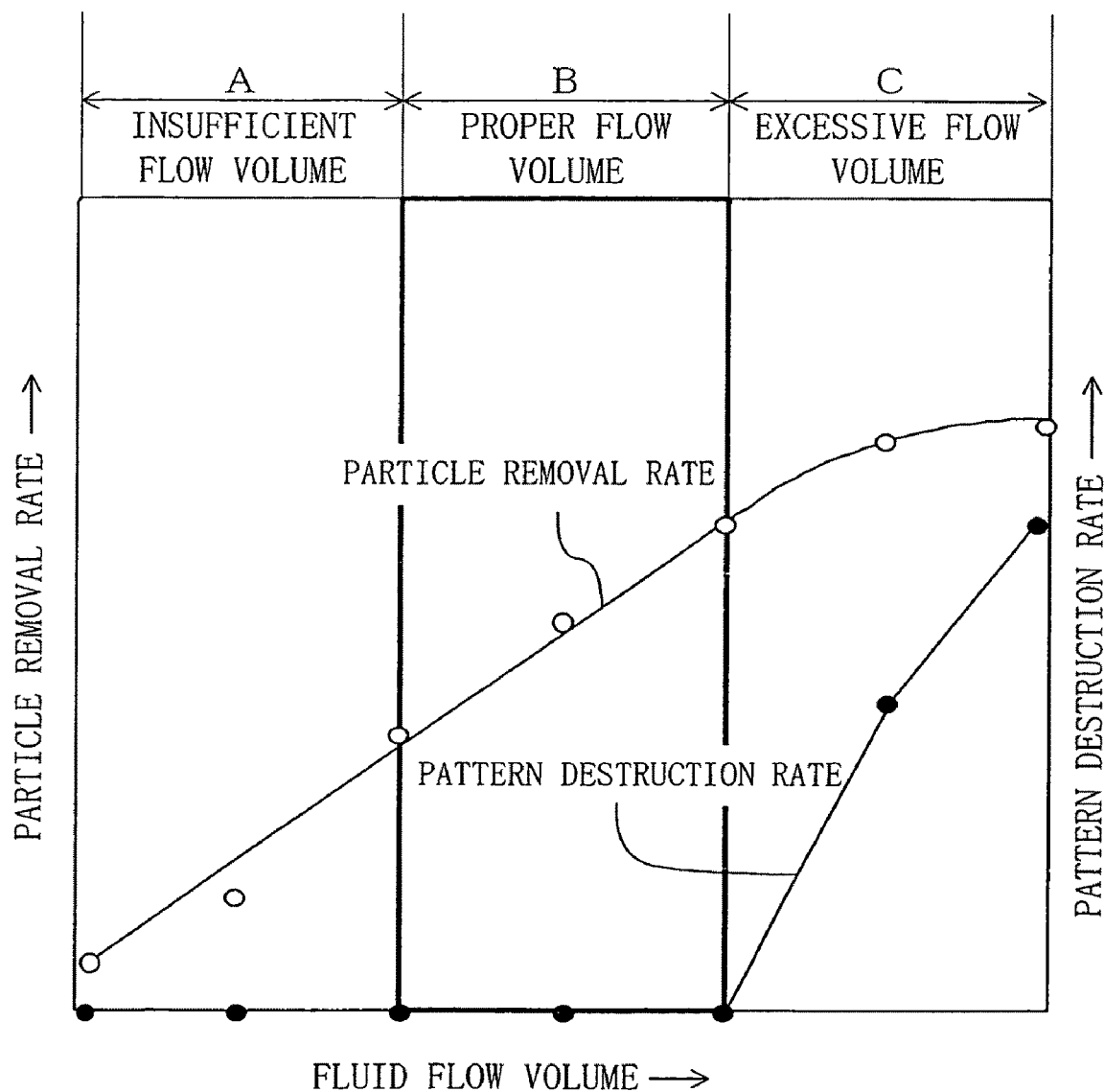
FIG. 6 is a characteristic graph showing particle removal rate and pattern destruction rate with respect to fluid flow rate.

FIG. 6 is a graph showing results of examinations of particle removal rate and pattern destruction rate with respect to fluid flow rate conducted by discharging a fluid using the fluid supply nozzle 100 of this embodiment to process a substrate. In FIG. 6, the abscissa indicates fluid flow rate and the ordinate indicates particle removal rate and pattern destruction rate.

In FIG. 6, in an excessive flow rate area indicated by C, the particle removal rate is very high. However, at the same time, the pattern destruction rate is high. This might cause reduction in a yield when a semiconductor device is fabricated.

Moreover, in an insufficient flow rate area indicated by A, the pattern destruction rate is very low and the particle removal rate is also low. Therefore, it is necessary to perform processing for a long time. As a result, a throughput is reduced, thus resulting in a drop of production efficiency.

Then, processing of a substrate is performed at the same fluid flow rate as that right before the pattern destruction rate starts increasing. Thus, the highest efficiency can be achieved in fabricating a semiconductor device. This applies to a proper flow rate area indicated by B in FIG. 6. As has been described before, with a silicon substrate with a diameter of 200 mm, the proper flow rate is, for example, 10-20 l/min.

Note that the line patterns 211 may be resist patterns formed as a mask used for etching. The line patterns 211 may be patterns formed on a post-etching semiconductor device including an insulating and a conduction film.

Moreover, the aspect ratio is set to be 3. However, with a pattern having an aspect ratio of 2.5 or more, the effect of preventing a pattern fall and the like can be achieved. As for the pattern width, the case of 0.13 μm has been described as an example. However, with a width of 0.13 μm or less, remarkable effects can be achieved. Furthermore, not only with line patterns but also with dot patterns, the effect of preventing a pattern fall can be achieved in the same manner.

Moreover, as a physical impact caused when the fluid falls onto the silicon substrate 210 is larger, electric charges generated due to friction of the fluid and the silicon substrate 210 is increased. Such electric charges are stored in the silicon substrate 210, and when an electric field becomes larger, destruction of patterns formed on the silicon substrate might be caused.

If processing is performed by discharging a fluid in a film shape, a physical impact can be eased and thus damages due to the above-described cause can be reduced.

As has been described, when processing is performed by supplying a fluid to an subject to be processed such as a silicon substrate at a proper flow rate using the fluid supply nozzle 100 of this embodiment, the following effects can be achieved.

First, a fluid is discharged in a film shape, so that the fluid can be supplied in a wide range by a single flow supply nozzle. Thus, necessity to dispose a plurality of fluid supply nozzles can be eliminated.

Moreover, at each part of a contact area of the subject to be processed with which the fluid falls to be in contact, the flow rate of the fluid (i.e., the flow rate of the supplied fluid per unit area and unit time) is uniform. Thus, a variation in processing caused depending on part of the substrate can be prevented.

Moreover, the fluid is discharged in a stable film shape, a physical impact caused when the fluid falls onto the substrate can be reduced. Accordingly, damages to the substrate can be reduced while the flow rate of the fluid can be increased. Therefore, processing efficiency and productivity can be improved.

Moreover, a physical impact is reduced, so that friction generated between the substrate and the fluid can be reduced. Thus, electric charges are stored in the substrate and the phenomenon of destruction of a pattern formed in the substrate by an electric field can be suppressed.

Note that in FIG. 4, the case where the fluid supply nozzle 100 is disposed so as to be parallel to the center axis 200 and the fluid is discharged in the parallel direction has been described. However, the above-described structure is preferable but not essential. This will be described hereinafter.

A fluid discharged by the fluid supply nozzle 100 has a driving force in the horizontal direction resulting from supply pressure except for the cases where the fluid is discharged in the vertical direction. However, the driving force in the horizontal direction is lost due to air resistance and the like after the fluid has been discharged. As a result, the fluid discharged in a single-layered, continuous film shape falls in the vertical direction by gravitation with the film shape maintained. It is desirable that the driving force in the horizontal direction is lost in such a manner and then the fluid falls in the vertical direction to the substrate. This is because in this manner, damages on a pattern or the like on the substrate due to the driving force in the horizontal direction can be prevented.

Furthermore, a distance from a point at which the fluid starts falling in the vertical direction when the driving force in the horizontal direction is lost after discharge to the substrate or the like is preferably small. Specifically, for example, the distance is preferably 5 mm or less. If the distance is large, an infall velocity of the fluid by gravitation is largely increased, so that a physical impact applied to the substrate is increased and the substrate is damaged. Therefore, to reduce damages, it is preferable that the distance when the fluid vertically falls is small.

The above-described effects can be achieved by setting of the dimensions and structure of a flow supply nozzle, an angle and a height at which the fluid supply nozzle is disposed.

With the above-described structure, it is not essential that the fluid supply nozzle 100 is disposed horizontally to the center axis 200 and the fluid is discharged horizontally. However, because influences of a driving force in the vertical direction at a time of discharging a fluid can be eased, it is preferable to discharge the fluid in the horizontal direction.

Second Embodiment

Next, a substrate processing apparatus according to a second embodiment of the present invention will be described with reference to the accompanying drawings.

Figure 7:
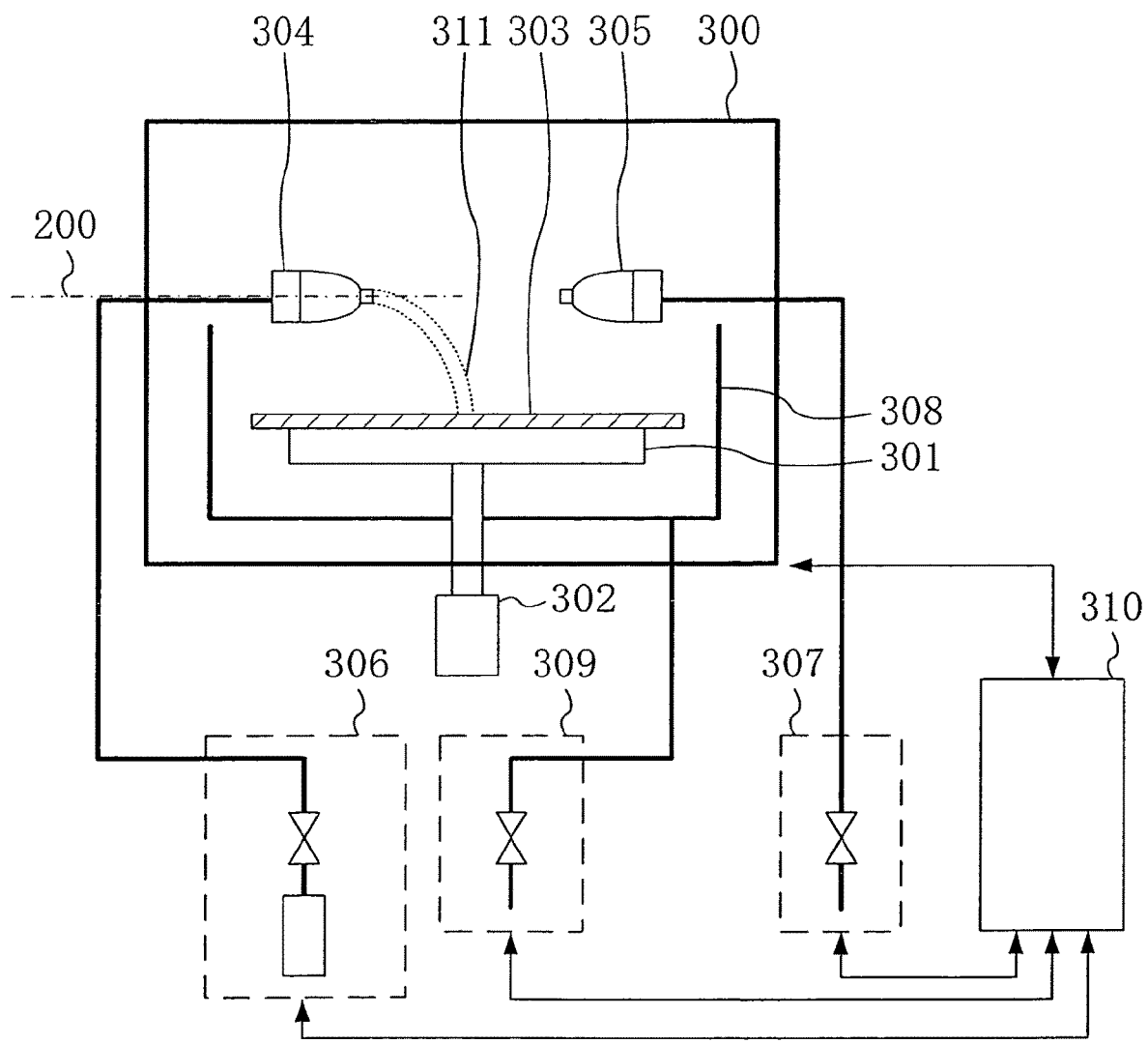
FIG. 7 is a diagram schematically illustrating the structure of a single-wafer-processing substrate processing apparatus according to a second embodiment of the present invention.

FIG. 7 is a diagram schematically illustrating the structure of a single-wafer-processing substrate processing apparatus using the fluid supply nozzle 100 of the first embodiment. With the apparatus, as an example, a silicon substrate is processed.

A rotation table 301 is horizontally disposed in a processing chamber 300. The rotation table 301 is connected to a driving section 302 so as to be rotated by a rotation operation of the driving section 302.

A silicon substrate 303 is disposed on the rotation table 301 and is rotated with the rotation table 301.

In the processing chamber 300, a chemical solution supply nozzle 304 for supplying a chemical solution used for performing processing such as etching to the silicon substrate 303 and a pure water supply nozzle 305 for performing pure water cleaning of the silicon substrate 303 are provided above the silicon substrate 303. Each of the chemical solution supply nozzle 304 and the pure water supply nozzle 305 has the same structure as that of the fluid supply nozzle 100 of this embodiment. Moreover, each of the chemical solution supply nozzle 304 and the pure water supply nozzle 305 is disposed so that the slit 105 (see FIG. 2B) is parallel to the silicon substrate 303. Specifically, each of the chemical solution supply nozzle 304 and the pure water supply nozzle 305 is disposed so that each of the length direction and the central axis 200 of an opening plane of the slit 105 is parallel to the silicon substrate 303. Thus, the fluid is discharged in a film shape parallel to the silicon substrate 303 and then falls.

A chemical solution discharged from the chemical solution supply nozzle 304 is supplied, with its temperature, flow rate and the like controlled by a chemical solution supply system 306 provided outside of the processing chamber 300 and including a temperature control function, a flow rate control function and the like. A chemical solution to be supplied may be supplied to the chemical solution supply system 306 through a centralized piping. As another option, the chemical solution supply system 306 may include a chemical solution tank, and a chemical solution to be supplied may be stored in the chemical solution tank.

Pure water to be discharged from the pure water supply nozzle 305 is supplied, with its temperature, flow rate and the like controlled by a pure water supply system 307 provided outside of the processing chamber 300 and including a temperature control function, a flow rate control function and the like. Pure water is normally supplied using a centralized piping but supply of pure water is not limited to this manner.

In the processing chamber 300, a protection wall 308 for preventing the fluid (such as a chemical solution or pure water) used in processing the silicon substrate 303 from dispersing in the processing chamber 300 is provided. The fluid used in processing is transported as a waste fluid to a waste fluid processing system 309 through a waste fluid piping provided in a lower potion of the processing chamber 300. The transported fluid is processed or recovered in the waste fluid processing system 309 or is transported to the outside of the substrate processing apparatus and then processed.

Moreover, a control system 310 is provided to control the driving section 302, the chemical solution supply system 306, the pure water supply system 307, the waste fluid processing system 309 and the like. That is, the rotation speed and rotation time of the driving section 302, the temperature and flow rate of a chemical solution or pure water, a method for processing a waste fluid, and the like are instructed by the control system 310.

Note that the slit of the chemical solution supply nozzle 304 is provided above the silicon substrate 303 so as to be located at a 30 mm distance from the silicon substrate 303. Moreover, discharged hydrofluoric acid 311 falls to in the vicinity of the center of the silicon substrate 303. This structure is preferable in terms of processing efficiency, processing uniformity and the like, but the present invention is not limited thereto.

If the substrate processing apparatus is formed so as to have the above-described structure, the structure of the substrate processing apparatus becomes more simple than that of the known substrate processing apparatus. This is because in the substrate processing apparatus of this embodiment, a chemical solution is supplied using a single chemical solution supply nozzle 304 whereas in the known substrate processing apparatus, a plurality of chemical solution supply nozzles are used at a time to supply a chemical solution of a single type. However, as a matter of course, a substrate processing apparatus using a plurality of chemical solution supply nozzles 304 of this embodiment can be formed if necessary.

Next, a method for processing a silicon substrate using the substrate processing apparatus of this embodiment will be described. In this case, as an example, etching is performed.

First, the silicon substrate 303 to be processed is disposed on the rotation table 301 in the processing chamber 300. The driving section 302 is operated according to the number of revolutions and time determined by the control system 310, so that the silicon substrate 303 is rotated with the rotation table 301.

Next, the hydrofluoric acid 311 is discharged as a chemical solution to the silicon substrate 303 in a rotation state.

Discharged hydrofluoric acid falls onto the silicon substrate 303. In this case, the slit 105 of the chemical solution supply nozzle 304 is disposed so as to be parallel to the silicon substrate 303, so that hydrofluoric acid is discharged to have a film shape parallel to the silicon substrate 303 right after the discharge. Thereafter, the hydrofluoric acid 311 falls onto the silicon substrate 303 so as to describe substantially circular arc with the single-layered film shape maintained. The hydrofluoric acid 311 continuously discharged for a period of time determined by the control system 310. Accordingly, the hydrofluoric acid 311 makes a single-layered, continuous film.

Thus, with hydrofluoric acid 311 supplied to the silicon substrate 303, wet etching is performed to the silicon substrate 303.

After the wet etching, pure water supplied by the pure supply system 307 is discharged from the pure water supply nozzle 305 and then cleaning is performed to the silicon substrate 303 to which wet etching has been performed.

In this case, pure water is discharged in a single-layered, continuous film shape and falls onto the silicon substrate 303 to describe a parabola.

Note that after the wet etching and the pure water cleaning, the silicon substrate 303 is rotation-dried. Specifically, by rotating the silicon substrate 303, hydrofluoric acid or pure water remaining on the silicon substrate 303 is removed using a centrifugal force.

Moreover, in performing the wet etching, hydrofluoric acid is supplied, for example, at a controlled temperature of 30° C. and at a flow rate of 15 l/min. Pure water used in pure water cleaning is supplied, for example, at a controlled temperature of 25° C. and at a flow rate of 15 l/min. The temperature, flow rate and the like of hydrofluoric acid are set or controlled in the above-described manner by the chemical solution supply system 306, the pure water supply system 307 and the control system 310 for controlling the chemical solution supply system 306 and the pure water supply system 307. However, the above-described numerical values are just examples and the temperature, flow rate and the like of hydrofluoric acid may be set as required.

Moreover, the hydrofluoric acid 311 and pure water used in processing are recovered by the waste fluid processing system 309 and then processed.

Moreover, in the substrate processing apparatus of this embodiment, only a single system chemical solution is used. However, with a plurality of chemical solution supply systems and the like provided as required, a plurality of chemical solutions can be also used.

If processing of a substrate is performed using a substrate processing apparatus according to this embodiment, the flow rate of a fluid can be increased without increasing a force directly applied to the substrate by the fluid. Thus, in the substrate, damages such as fall or peeling of a line pattern causing a loss of the line pattern can be reduced and also processing efficiency and productivity can be improved.

Moreover, a single fluid supply nozzle is used for a single system solution. Thus, the structure of the substrate processing apparatus can be simplified. Also, a substrate processing apparatus for performing a plurality of processing in the same chamber can be configured in a simple manner. Furthermore, condition determinations in performing processing can be made in a simple manner, so that conditions can be determined in a short time.

Note that in this embodiment, the chemical solution supply nozzle 304 and the like are disposed so that the center axis 200 is horizontal. However, as described in the first embodiment, as long as a driving force in the horizontal direction is lost and then a fluid discharged in a single-layered, continuous film shape falls onto the substrate 303 in the vertical direction, the above-described structure is not essential.

Third Embodiment

Next, a fluid supply nozzle according to a third embodiment of the present invention will be described with reference to the accompanying drawings.

Figure 8:
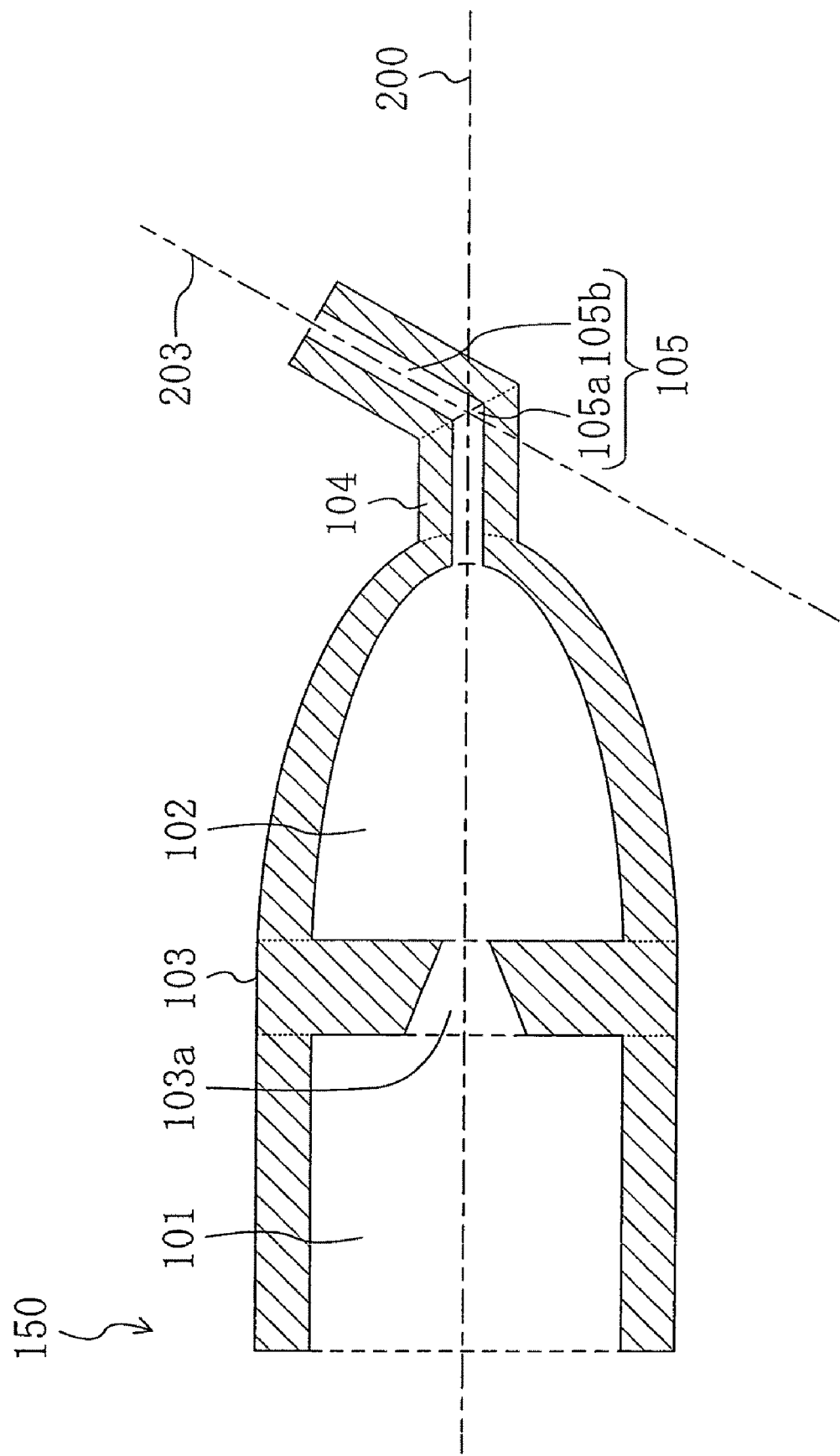
FIG. 8 is a view schematically illustrating a vertical cross section of a fluid supply nozzle according to a third embodiment of the present invention.

FIG. 8 is a view illustrating a vertical cross section of a fluid supply nozzle 150 according to this embodiment. FIG. 8 corresponds to FIG. 2B illustrating a vertical cross section of the fluid supply nozzle 100 of the first embodiment. Except for points made in the following description, an appearance of the fluid supply nozzle 150 is similar to that of the fluid supply nozzle 100 of FIG. 1. Moreover, the fluid supply nozzle 150 has a similar horizontal cross section to that of FIG. 2A. Thus, in FIG. 8, each member also shown in FIG. 2B is identified by the same reference numeral and therefore detail description thereof will be omitted. Each of FIG. 2A and FIG. 8 is a cross-sectional view schematically illustrating the structure of each of the fluid supply nozzles 100 and 150 but different scales are used in FIG. 2A and FIG. 8.

FIG. 8 is different from FIG. 2B in that each of the discharging section 104 and the slit 105 provided in the discharging section 104 has a bent shape. Specifically, the slit 105 includes a slit rear portion 105a extending from the reservoir section 102 along the center axis 200 and a slit front portion 105b connected to the slit rear portion 105a and extending so as to make an angle with the center axis 200. The discharging section 104 includes the slit 105 with this structure.

Note that the slit front portion 105b has the same cross section to that of FIG. 2C.

Other than that, as has been described, the structure of the fluid supply nozzle 150 is the same as that of fluid supply nozzle 100 shown in FIG. 1 and FIGS. 2A through 2C.

Note that the direction in which the slit front portion 105b extends can be expressed by a straight line 203 extending so as to make, for example, an angle of 60 degree with the central axis 200, i.e., the direction in which the slit rear portion 105b extends.

When a fluid is discharged using the fluid supply nozzle 150 of this embodiment, as the fluid supply nozzle 100 of the first embodiment, the fluid is discharged in a single-layered, continuous film and the discharged fluid has a uniform flow rate. Therefore, each of the effects of the present invention described in the first and second embodiments can be achieved.

Moreover, as a matter of course, forming a fluid supply nozzle of a combination of a plurality of different components, disposing a mesh and the like in the vicinity of the slit 105 of the reservoir section 102 to make a fluid include bubbles and the like can be applied to the fluid supply nozzle 150 as to the fluid supply nozzle 100 of the first embodiment.

However, in the fluid supply nozzle 150 of the third embodiment, a fluid can be discharged in the direction in which the straight line 203 extends so as to make an angle with the center axis 200 whereas in the fluid supply nozzle 100 of the first embodiment, a fluid is discharged in the parallel direction to the center axis 200. This is because the slit 105 is bent. Therefore, use of the fluid supply nozzle 150 in a substrate processing apparatus increases a degree of flexibility in the structure of a substrate processing apparatus to a higher level than that in the case of using the fluid supply nozzle 100. The degree of flexibility will be discussed in the following description.

Figure 9:
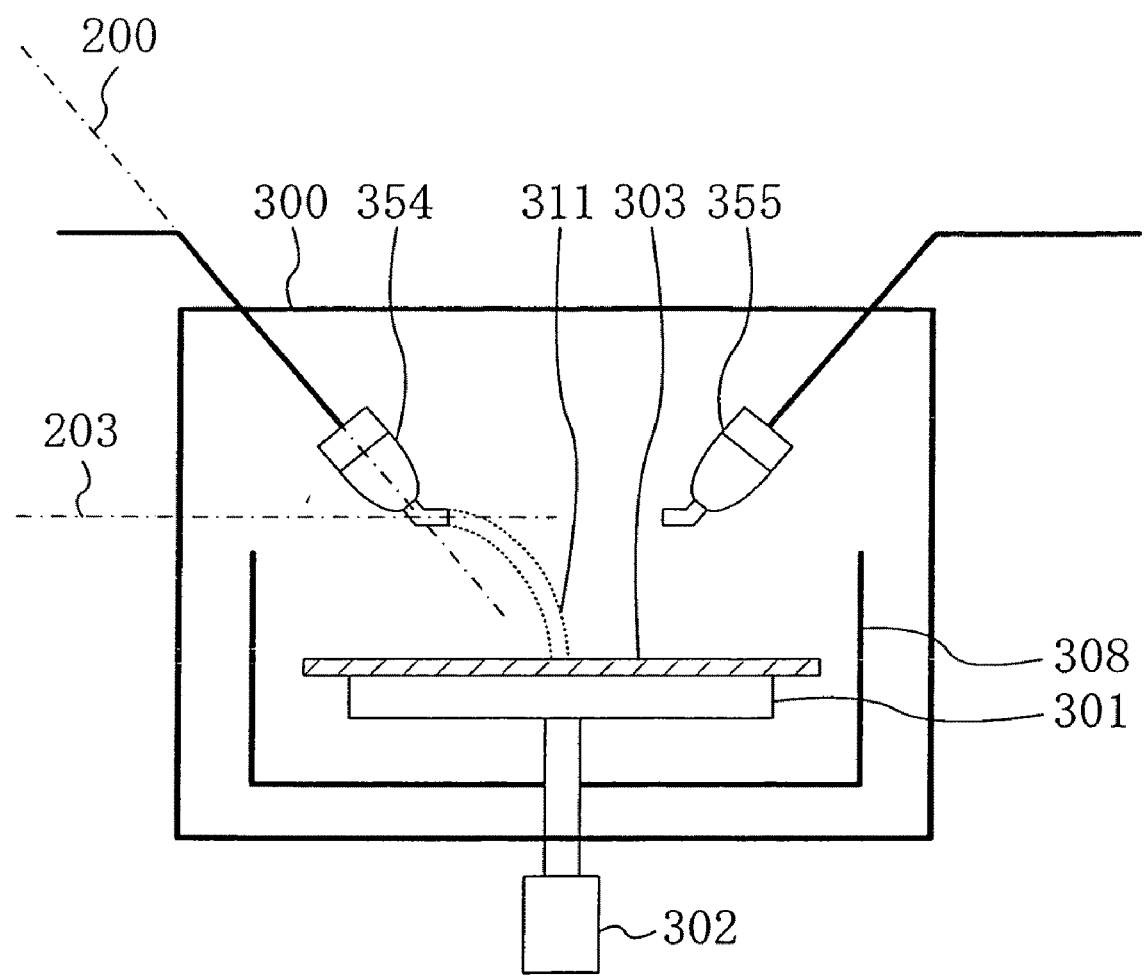
FIG. 9 is a view schematically illustrating the structure of a substrate processing apparatus according to the third embodiment of the present invention.

FIG. 9 is a view schematically illustrating the structure of a substrate processing apparatus according to the third embodiment. Except that two fluid supply nozzles 150, i.e., a chemical solution supply nozzle 354 and a pure water supply nozzle 355 are used, the fluid supply apparatus of FIG. 9 has the same structure as that of the substrate processing apparatus of the second embodiment shown in FIG. 7. In FIG. 9, each member also shown in FIG. 7 is identified by the same reference numeral and therefore detail description thereof will be omitted. Moreover, illustration of the chemical solution supply system 306 and the like provided outside of the processing chamber 300 are also omitted.

In the substrate processing apparatus of the second embodiment, the fluid supply nozzle 100 is disposed so that the center axis 200 is horizontal. In contrast, as shown in FIG. 9, in the substrate processing apparatus of this embodiment, each of the chemical solution supply nozzle 354 and the pure water supply nozzle 355 is disposed so that the straight line 203 indicating the direction in which the slit front portion 105b extends is horizontal (i.e., parallel to the silicon substrate 303). As a result, the center axis 200 is inclined.

In some cases, the chemical solution supply nozzle 354 and the like can be moved from above the silicon substrate 303 to some other position to be stored except when a fluid is discharged. In that case, if the center axis 200 of the chemical solution supply nozzle 354 or the like is disposed to be inclined, a projection area when the substrate processing apparatus is viewed directly from the top becomes smaller. Therefore, a space for storing the chemical solution supply nozzle 354 and the like can be ensured in a simple manner.

Accordingly, compared to the substrate processing apparatus of the second embodiment, many fluid supply nozzles 150 can be disposed in the processing chamber 300.

Moreover, when the protection wall 308 for preventing a fluid from dispersing in the processing chamber 300 is provided, a possibility of interference between the protection wall 308 and the chemical solution supply nozzle 354 and the like can be suppressed. This is because unlike the second embodiment, the chemical solution supply nozzle 354 and the like do not have to be disposed horizontally but can be disposed so as to be inclined.

As has been described, with use of the fluid supply nozzle 150, the direction in which the center axis 200 of the fluid supply nozzle extends and the direction in which the slit front portion 105b extends, i.e., the direction in which a fluid is discharged can be set different to each other. Therefore, the degree of flexibility in design of a substrate processing apparatus is increased.

Note that in the fluid supply nozzle 105, the slit front portion 105b is connected to the slit rear portion 105a so as to make an angle of 60 degree with the center axis 200. However, the angle between the slit front portion 105b and the slit rear portion 105a may be some other angle than 60 degree and may be set at a proper degree as required.

Moreover, the slit 105 may be formed so as to have a structure in which the slit 105 extends straight without a bend and is connected to the reservoir section 102 so as to make an angle with the center axis 200 at its contact point with the reservoir section 102. Furthermore, the slit 105 may have a vertical cross-section with a smoothly curved shape, as long as the slit 105 can discharge a fluid with an angle with respect to the center axis 200.

As has been described, with the fluid supply nozzle 150 of this embodiment, the same effects as those of each of the first and second embodiments can be achieved. In addition, the effect of increasing in the degree of flexibility in design of a substrate processing apparatus can be achieved. For example, in the processing chamber 300, a space necessary for storage can be reduced and the number of fluid supply nozzles which can be provided in the processing chamber 300 can be increased.

Note that in this embodiment, the chemical solution supply nozzle 354 and the like are disposed so that the direction 203 in which the slit front portion 105b extends is horizontal and a chemical solution can be discharged in a film shape parallel to the substrate 303. However, as described in the first embodiment, the discharged fluid does not have to have the above-described shape, but the direction 203 in which the slit front portion 105b extends may be inclined. However, the length direction of the slit 105 is preferably horizontal.

Fourth Embodiment

Next, a fluid supply nozzle according to a fourth embodiment of the present invention will be described with reference to the accompanying drawings.

Figure 10A:
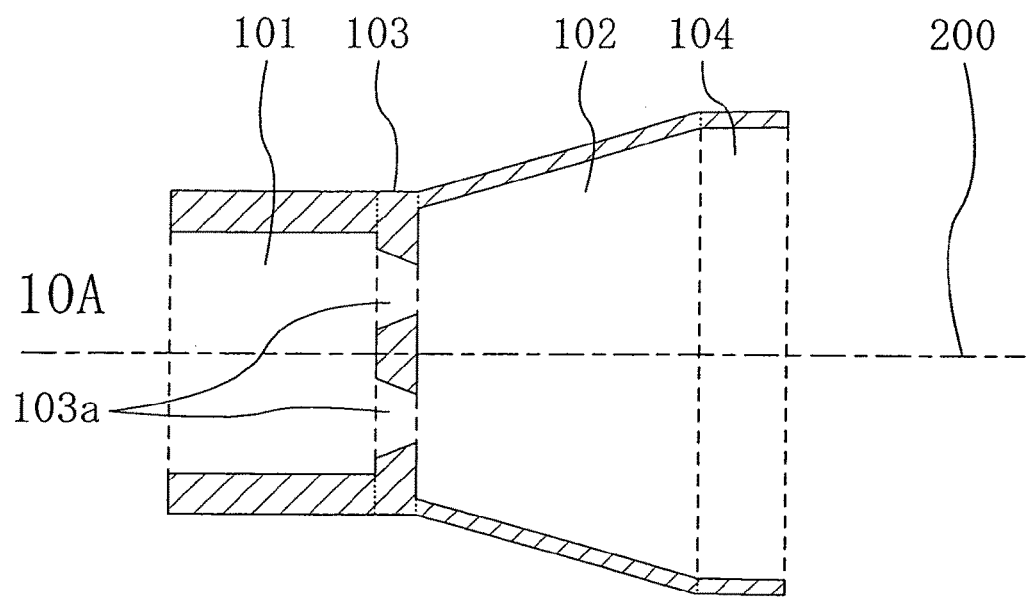
FIGS. 10A, 10B and 10C are cross-sectional views schematically illustrating the structure of a fluid supply nozzle according to a fourth embodiment of the present invention.
Figure 10B:
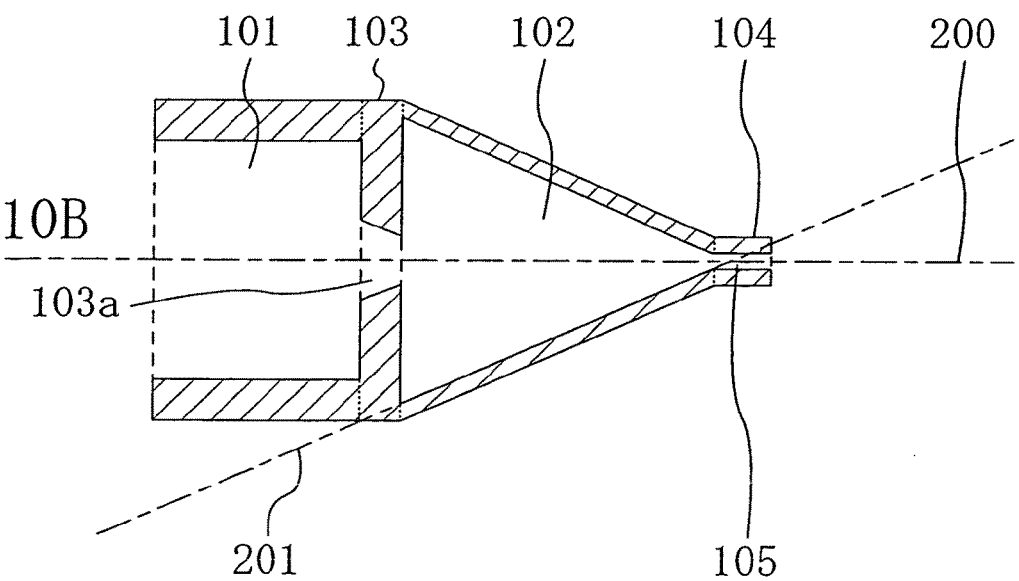
Figure 10C:
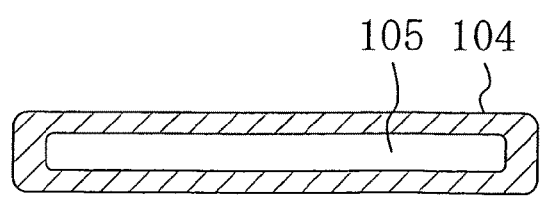

Except for points made in the following description, the fluid supply nozzle of the fourth embodiment has the same structure as that of the fluid supply nozzle of the first embodiment shown in FIGS. 2A through 2C. FIGS. 10A through 10C are cross-sectional views illustrating the structure of a fluid supply nozzle of the fourth embodiment. In FIGS. 10A through 10C, each member also shown in FIGS. 2A through 2C is identified by the same reference numeral and therefore detail description thereof will be omitted.

Note that as FIGS. 2A through 2C, FIGS. 10A and 10B are horizontal and vertical cross-sectional views of the fluid supply nozzle, respectively. Moreover, FIG. 10C is a view illustrating cross-sectional shapes of the discharging section 104 and the slit 105.

In the structure of the fluid supply nozzle of this embodiment, compared to the fluid supply nozzle of the first embodiment, the vertical cross section of FIG. 10B has a different shape.

In the fluid supply nozzle of the first embodiment, as shown in FIG. 2B, the reservoir section 102 has a shape with part expanding outward with respect to a straight line 201 joining a contact point between the reservoir section 102 and the flow velocity control wall 103 and a contact point between the reservoir section 102 and the discharging portion 104.

In contrast, in the fluid supply nozzle of this embodiment, as shown in FIG. 10B, the reservoir section 102 has a shape with a side corresponding to the straight line 201.

As the fluid supply nozzle of the first embodiment, if the reservoir section 102 has a shape with part expanding outward, a sufficient volume of fluid can be stored in the reservoir section 102. Therefore, this shape of the fluid supply nozzle of the first embodiment is preferable.

However, depending on the type of a used fluid, dimensions of the reservoir section 102 and the like, even with the shape described in this embodiment, the reservoir section 102 can store a sufficient volume of a fluid and exhibit the same effects as those of the fluid supply nozzle of the first embodiment.

As a specific example, if ultra-pure water is used as a fluid, a structure in which the fluid flow-in section 101 has a circular cross sectional shape with a diameter of 20 mm, the length from the flow velocity control wall 103 extending along the center axis 200 to the discharging section 104 is 46 mm and a dimension of the slit 105 in the length direction is 48 mm may be used. With these dimensions, for example, the substrate processing apparatus can sufficiently exhibit an effect of the present invention to allow discharge of the fluid in a single-layered, continuous film shape.

If processing of a substrate is performed using a fluid supply nozzle according to this embodiment, the same effects as those described in the first embodiment can be achieved. That is, the effects of reduction in a variation in processing, suppression of damages on a pattern formed on a substrate, improvement of processing efficiency and throughput and the like can be achieved.

Moreover, a substrate processing apparatus is formed using a fluid supply nozzle according to this embodiment, as descried in the second embodiment, the effect of simplifying the structure of the substrate processing apparatus or like effects can be achieved.

Furthermore, as the fluid supply nozzle of the third embodiment, the fluid supply nozzle of this embodiment may include the slit 105 with a bend shape. Thus, the same effects as those described in the third embodiment can be achieved. The effects includes the effect of improving the degree of flexibility with respect to the structure of a substrate processing apparatus.

Fifth Embodiment

Next, a fluid supply nozzle according to a fifth embodiment of the present invention will be described with reference to the accompanying drawings.

Figure 11A:
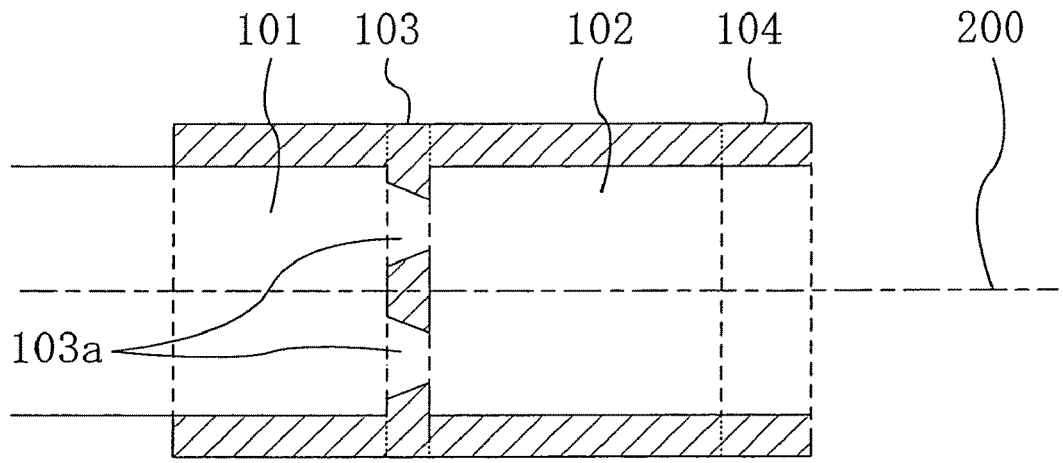
FIGS. 11A, 11B and 11C are cross-sectional views schematically illustrating the structure of a fluid supply nozzle of a fifth embodiment of the present invention.
Figure 11B:
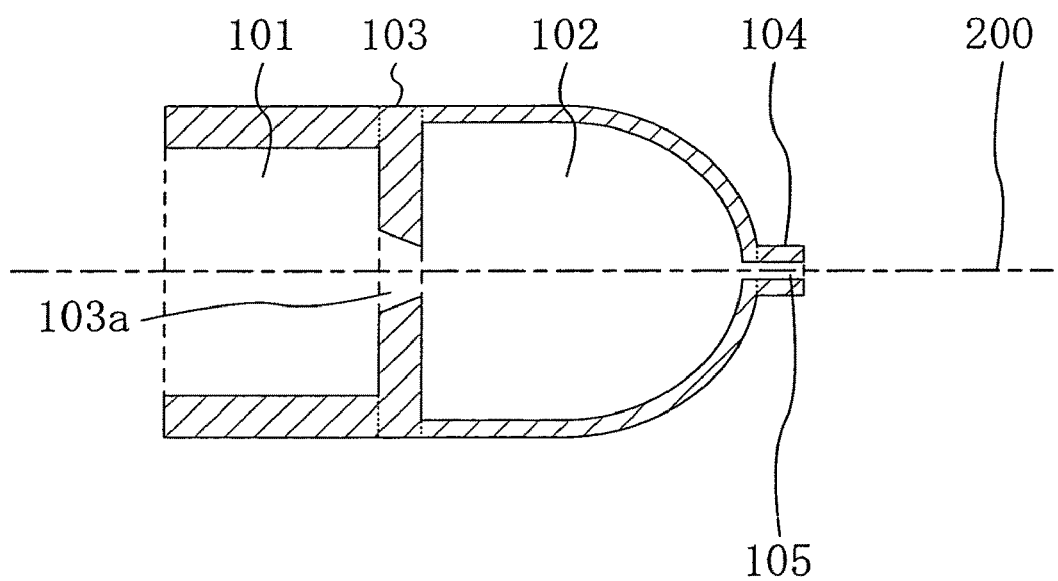
Figure 11C:
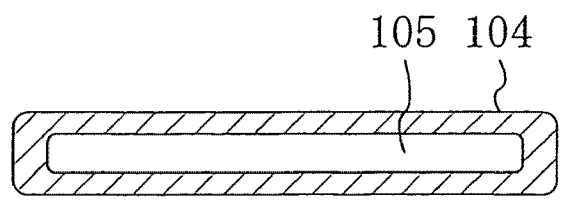

Except for points made in the following description, the fluid supply nozzle of the fifth embodiment has the same structure as that of the fluid supply nozzle of the first embodiment shown in FIGS. 2A through 2C. FIGS. 11A through 11C are cross-sectional views illustrating the structure of a fluid supply nozzle of the fifth embodiment. In FIGS. 11A through 11C, each member also shown in FIGS. 2A through 2C is identified by the same reference numeral and therefore detail description thereof will be omitted.

Note that as FIGS. 2A through 2C, FIGS. 11A and 11B are horizontal and vertical cross-sectional views of the fluid supply nozzle, respectively. Moreover, FIG. 11C is a view illustrating cross-sectional shapes of the discharging section 104 and the slit 105.

As will be described in the following, in the structure of the fluid supply nozzle of this embodiment, compared to the fluid supply nozzle of the first embodiment, the horizontal cross section of FIG. 11A has a different shape.

In the fluid supply nozzle of the first embodiment, as shown in the horizontal cross section of FIG. 2A, the reservoir section 102 has a shape expanding as proceeding in the horizontal direction from the flow velocity control wall 103 to the discharging section 104.

In contrast, in the fluid supply nozzle of this embodiment, as shown in the horizontal cross section of FIG. 11A, the reservoir section 102 has a shape with a constant width as proceeding in the horizontal direction.

As an example, the fluid supply nozzle of this embodiment which is suitable for processing a silicon substrate with a diameter of 200 mm includes the fluid flow-in section 101 with an inner diameter of 50 mm. Moreover, the flow velocity control wall 103 has a thickness of 10 mm, the orifice 103a has a truncated cone shape with a diameter of 5 mm at the fluid flow-in section 101 side and a diameter of 4 mm at the reservoir section 102 side. Furthermore, in the slit 105, a length from a contact point with the reservoir section 102 to a tip (opening plane) is 5 mm. The opening plane has a length of 50 mm in the length direction and a width of 0.7 mm. However, as a matter of course, the fluid supply nozzle of the present invention may have different dimensions and some other shape from those described above.

When the fluid supply nozzle with this structure is used, the same effects as those of the fluid supply nozzle of the first embodiment can be exhibited.

Moreover, with use of the fluid supply nozzle of this embodiment in a substrate processing apparatus, the same effects as those of the second embodiment may be achieved and the effects of the third embodiment in which the slit 105 is formed so as to have a bend shape can be achieved.

Sixth Embodiment

Next, a fluid supply nozzle according to a sixth embodiment of the present invention will be described with reference to the accompanying drawings.

Figure 12:
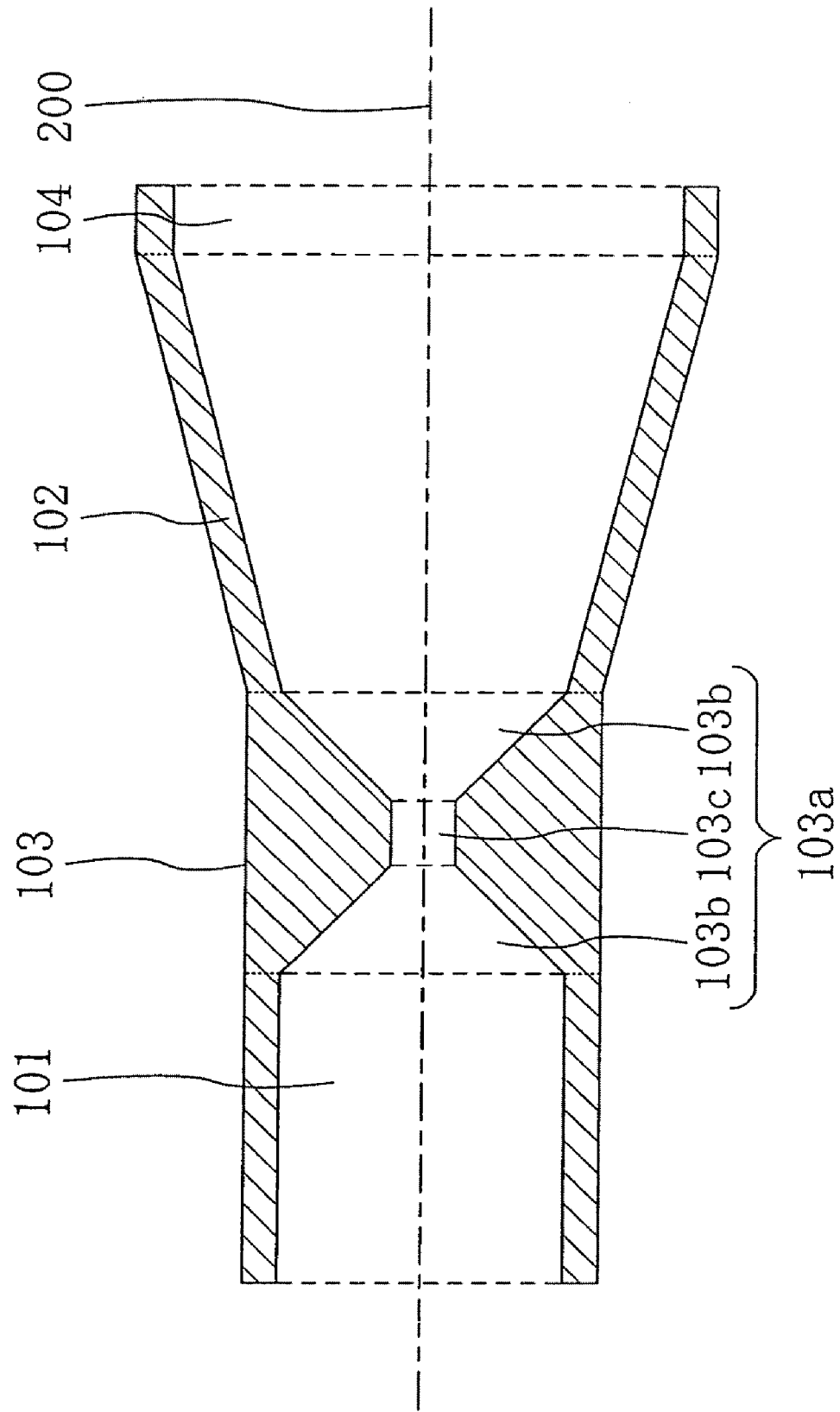
FIG. 12 is a view schematically illustrating a vertical cross section of a fluid supply nozzle according to a sixth embodiment of the present invention.
Figure 13:
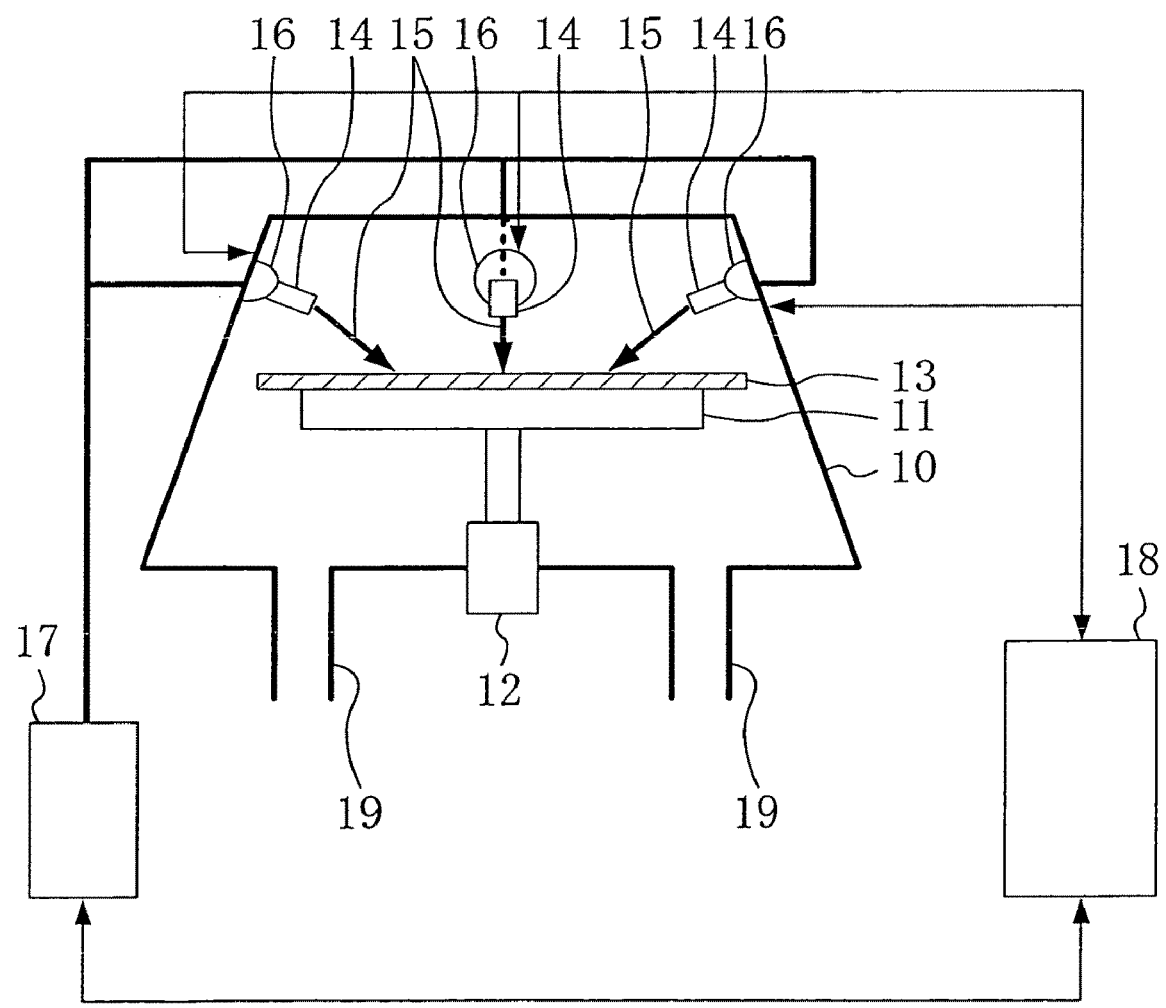
FIG. 13 is a view schematically illustrating the structure of a known substrate processing apparatus.

Except that the shapes of the flow velocity control wall 103 and the orifice 103a provided in the flow velocity control wall 103 are different to those in the first embodiment, the fluid supply nozzle of this embodiment has the same structure as that of the fluid supply nozzle of the first embodiment shown in FIGS. 2A through 2C. FIG. 12 is a cross-sectional view illustrating the structure of a fluid supply nozzle of the sixth embodiment. In FIG. 12, each member also shown in FIGS. 2A through 2C is identified by the same reference numeral and therefore detail description thereof will be omitted.

In the fluid supply nozzle of the first embodiment, the flow velocity control wall 103 has a flat plane shape and divides the fluid flow-in section 101 and the reservoir section 102 from each other. The orifice 103a provided in the flow velocity control wall 103 has a truncated cone shape in which the inside diameter increases as proceeding toward the fluid flow-in section 101 side.

In contrast, in the fluid supply nozzle of the sixth embodiment, the orifice 103a includes a cavity space 103c having a cylindrical shape with a smaller cross-sectional area than that of the fluid flow-in section 101 and cavity spaces 103b having a tapered shape and provided in the fluid flow-in section 101 side and the reservoir section 102 side, respectively. In other words, the orifice 103a has a conical shape in which the inside diameter is smoothly reduced as proceeding from each of the fluid flow-in section 101 side and the reservoir section 102 side to the space 103c formed in the center of the flow velocity control wall 103 and having a small cross-sectional area. The vertical cross-sectional shape of the flow velocity control wall 103 in the fluid supply nozzle of this embodiment is not shown, but the vertical cross-sectional shape is the same as the horizontal cross-sectional shape. However, this is not an essential point.

Also, with the fluid supply nozzle including the flow velocity control wall 103 with the above-described structure, the effect of discharging a fluid in a single-layered, continuous film shape can be achieved. Thus, each of the effects of the present invention which has been already described can be achieved.

Moreover, when the orifice 103a is formed so as to have the structure of this embodiment, compared to the fluid supply nozzle of the first embodiment in which the flow velocity control wall 103 is a flat plate shape, a fluid smoothly flows from the fluid flow-in section 101 to the reservoir section 102. Therefore, with the discharged fluid maintained in the film shape, the flow rate of the fluid can be increased, so that fluid exchangeability can be improved. As a result, processing efficiency and processing speed are improved furthermore.

As an example, when a silicon substrate with a diameter of 200 mm is processed, the fluid supply nozzle preferably has the following dimensions and a shape. That is, it is preferable that the fluid flow-in section 101 has a circular cross sectional shape with an inner diameter of 20 mm, the flow rate control wall 103 has a thickness of 24 mm, the cavity space 103c has a cylindrical shape with an inner diameter of 5 mm and a length of 5 mm.

As described above, the structure of each of the flow velocity control wall 103 and the orifice 103a is not specifically limited but may be in any form as long as the flow velocity of a fluid is sufficiently reduced when the fluid flows in the reservoir section 102.

Note that the shape of the reservoir section 102 may have any one of the shapes of the reservoir section of the first, fourth and fifth embodiments.

Note that in the first through sixth embodiments, the case where a silicon substrate is processed with a fluid has been described. However, the present invention is not limited thereto. Other than the described case, the present invention is applicable to, for example, a resist developing apparatus used in lithography process steps and also can be used in pure water cleaning after development processing.

Moreover, the present invention particularly exhibits marked effects when it is required to increase the flow rate of a fluid and discharge the fluid at high pressure. Specifically, for example, the present invention may be used for a flat display panel such as a liquid crystal display device and a PDP and also can be used in forming a photo mask used for fabricating the liquid crystal display device, the flat display panel and the like.

In such a case, a suitable flow rate of a fluid for processing differs depending on the size of a subject to be processed. However, the size of each member of the fluid supply nozzle may be changed and the fluid supply nozzle may be formed so that a fluid is discharged so as to fall onto the subject to be processed with its single-layered, continuous film shape maintained.

Moreover, the case where a substrate is rotated and processing is performed has been described. However, in the case where a flat display panel or the like having a larger size than that of a silicon substrate and the like is processed, it might be difficult to rotate the subject to be processed and perform processing. In such a case, processing may be formed by scanning a fluid supply nozzle over the subject to be processed. Alternatively, processing may be performed while the subject to be processed is moved with the fluid supply nozzle remained at rest.

Moreover, when processing power by a single fluid supply nozzle is insufficient, i.e., in the case where a subject to be processed has a specially large size and the like, as a matter of course, the same fluid can be supplied by a plurality of fluid supply nozzles.

Moreover, the fluid supply nozzle of any one of the embodiments has the fluid flow-in section 101 and the reservoir section 102 each of which has horizontal and vertical cross sections each having a symmetrical shape with respect to the center axis 200. However, this is not essential point.

Moreover, in the fluid supply nozzle of any one of the embodiments, the discharge section 104 having the slit 105 is provided as a separate member connected to the reservoir section 102. However, the fluid supply nozzle may be formed so as to have a structure in which the discharging section 104 is not provided as a separate member and the slit 105 is provided directly in the reservoir section 102.

What is claimed is:

1. A substrate processing apparatus in which a fluid is supplied onto a substrate to perform surface processing of the substrate, the apparatus comprising:
    a flow rate control system for controlling a flow rate of a fluid flowing into a fluid supply nozzle,
    wherein the fluid supply nozzle comprises:
        a fluid flow-in section into which the fluid flows in;
        a reservoir section, connected to the fluid flow-in section, for storing the fluid;
        a flow velocity control wall provided between the fluid flow-in section and the reservoir section and including an orifice for passing the fluid therethrough while reducing a flow velocity; and
        a discharging section connected to the reservoir section and including a slit for discharging the fluid with pressure of the fluid which has passed through the orifice,
    wherein the fluid is supplied from the fluid supply nozzle to the substrate,
    wherein a length direction of an opening of the slit and a direction in which the fluid is discharged from the slit are substantially parallel to the substrate which is horizontally placed, and
    wherein a cross section of the reservoir section taken along the perpendicular direction to the length direction of the opening plane of the slit has a shape with a part expanding toward an opposing side to the flow velocity control wall with respect to a straight line joining a contact point between an inner wall of the reservoir section and the flow velocity control wall and a contact point between the inner wall of the reservoir section and the slit.

2. The substrate processing apparatus of claim 1, wherein the fluid discharged from the fluid supply nozzle in a continuous film shape falls onto the substrate and is supplied to the substrate so that a flow rate of the fluid is uniform at each contact part of the substrate with the fluid when the fluid is in contact with the substrate.

3. The substrate processing apparatus of claim 1, wherein the slit has an opening plane with the ratio of a length of the slit in the horizontal direction to a width of the slit in the vertical direction is 10 or more.

4. The substrate processing apparatus of claim 1, wherein the fluid is discharged through the slit in the direction making an angle with a center axis of the fluid supply nozzle.

5. A substrate processing apparatus in which a fluid is supplied onto a substrate to perform surface processing of the substrate, the apparatus comprising:
    a flow rate control system for controlling a flow rate of a fluid flowing into a fluid supply nozzle,
    wherein the fluid supply nozzle comprises:
        a fluid flow-in section into which the fluid flows in;
        a reservoir section, connected to the fluid flow-in section, for storing the fluid;
        a flow velocity control wall provided between the fluid flow-in section and the reservoir section and including an orifice for passing the fluid therethrough while reducing a flow velocity; and
        a discharging section connected to the reservoir section and including a slit for discharging the fluid with pressure of the fluid which has passed through the orifice,
    wherein the fluid is supplied from the fluid supply nozzle to the substrate,
    wherein a length direction of an opening of the slit and a direction in which the fluid is discharged from the slit are substantially parallel to the substrate which is horizontally placed, and
    wherein a cross section of the reservoir section taken along the perpendicular direction to the length direction of the opening plane of the slit has a shape with a part bulging toward an opposing side to the flow velocity control wall with respect to a line joining a contact point between an inner wall of the reservoir section and the flow velocity control wall and a contact point between the inner wall of the reservoir section and the slit.

6. The substrate processing apparatus of claim 5, wherein the fluid discharged from the fluid supply nozzle in a continuous film shape falls onto the substrate and is supplied to the substrate so that a flow rate of the fluid is uniform at each contact part of the substrate with the fluid when the fluid is in contact with the substrate.

7. The substrate processing apparatus of claim 5, wherein the slit has an opening plane with the ratio of a length of the slit in the horizontal direction to a width of the slit in the vertical direction is 10 or more.

8. A substrate processing method in which a fluid is supplied from a fluid supply nozzle onto a substrate to perform surface processing of the substrate, the method comprising the steps of:
    pumping a fluid into a fluid flow-in section included in the fluid supply nozzle;
    storing the fluid pumped into the fluid flow-in section in a reservoir section included in the fluid supply nozzle while passing the fluid through a flow velocity control wall including an orifice to reduce a flow velocity;
    discharging the fluid, with pressure of the fluid which has passed through the orifice, from a slit included in a discharging section connected to the reservoir section; and
    dropping and supplying the fluid discharged from the slit onto the substrate, wherein the fluid supply nozzle adjusts a flow velocity of the fluid to drop the fluid onto the substrate so that the fluid has a continuous film shape, is discharged in a direction substantially parallel to the substrate which is horizontally placed, and a flow rate of the fluid is uniform at each contact part of the substrate with the fluid when the fluid is in contact with the substrate, and wherein a cross section of the reservoir section taken along the perpendicular direction to the length direction of the opening plane of the slit has a shape with a part expanding toward an opposing side to the flow velocity control wall with respect to a straight line joining a contact point between an inner wall of the reservoir section and the flow velocity control wall and a contact point between the inner wall of the reservoir section and the slit.

9. The substrate processing method of claim 8, wherein a pattern having a width of 0.13 μm or less and an aspect ratio of 2.5 or more is formed on the substrate.

10. A substrate processing method in which a fluid is supplied from a fluid supply nozzle onto a substrate to perform surface processing of the substrate, the method comprising the steps of:

pumping a fluid into a fluid flow-in section included in the fluid supply nozzle;

storing the fluid pumped into the fluid flow-in section in a reservoir section included in the fluid supply nozzle while passing the fluid through a flow velocity control wall including an orifice to reduce a flow velocity;

discharging the fluid, with pressure of the fluid which has passed through the orifice, from a slit included in a discharging section connected to the reservoir section; and dropping and supplying the fluid discharged from the slit onto the substrate, wherein the fluid supply nozzle adjusts a flow velocity of the fluid to drop the fluid onto the substrate so that the fluid has a continuous film shape, is discharged in a direction substantially parallel to the substrate which is horizontally placed, and a flow rate of the fluid is uniform at each contact part of the substrate with the fluid when the fluid is in contact with the substrate, and wherein a cross section of the reservoir section taken along the perpendicular direction to the length direction of the opening plane of the slit has a shape with a part bulging toward an opposing side to the flow velocity control wall with respect to a line joining a contact point between an inner wall of the reservoir section and the flow velocity control wall and a contact point between the inner wall of the reservoir section and the slit.

11. The substrate processing method of claim 10, wherein a pattern having a width of 0.13 μm or less and an aspect ratio of 2.5 or more is formed on the substrate.

* * * * *